United States Patent
Watanabe

(10) Patent No.: US 7,742,331 B2
(45) Date of Patent: Jun. 22, 2010

(54) NONVOLATILE SEMICONDUCTOR MEMORY DEVICE AND DATA ERASE/WRITE METHOD THEREOF

(75) Inventor: Toshiharu Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 268 days.

(21) Appl. No.: 12/056,919

(22) Filed: Mar. 27, 2008

(65) Prior Publication Data

US 2008/0239799 A1    Oct. 2, 2008

(30) Foreign Application Priority Data

Mar. 29, 2007   (JP) ............................... 2007-087201

(51) Int. Cl.
*G11C 11/00* (2006.01)
(52) U.S. Cl. ...................... 365/163; 365/148
(58) Field of Classification Search ................. 365/168, 365/148, 100
See application file for complete search history.

(56) References Cited

U.S. PATENT DOCUMENTS

| | | |
|---|---|---|
| 7,002,837 B2 | 2/2006 | Morimoto |
| 7,372,726 B2 * | 5/2008 | Matsuoka et al. ........... 365/163 |
| 7,474,555 B2 * | 1/2009 | Nirschl et al. ............... 365/163 |
| 7,558,099 B2 * | 7/2009 | Morimoto .................... 365/148 |

FOREIGN PATENT DOCUMENTS

| | | |
|---|---|---|
| JP | 2004-272975 | 9/2004 |
| JP | 2006-135338 | 5/2006 |

OTHER PUBLICATIONS

S. Q. Liu, et al., "Electric-pulse-induced reversible resistance change effect in magnetoresistive films", Applied Physics Letters, vol. 76, No. 19, May 8, 2000, pp. 2749-2751.

* cited by examiner

*Primary Examiner*—Anh Phung
(74) *Attorney, Agent, or Firm*—Oblon, Spivak, McClelland, Maier & Neustadt, L.L.P.

(57) ABSTRACT

A nonvolatile semiconductor memory device includes a memory cell array which includes a memory cell string including a plurality of memory cells each having a variable resistor element and a switching element having a current path with one end and the other end, between which the variable resistor element is connected, the plurality of memory cells having current paths thereof being connected in series, the memory cell array further including a first select element connected to one end of a current path of the memory cell string, and a second select element connected to the other end of the current path of the memory cell string, a bit line which is electrically connected to one end of a current path of the first select element, and a source line which is electrically connected to one end of a current path of the second select element.

19 Claims, 18 Drawing Sheets

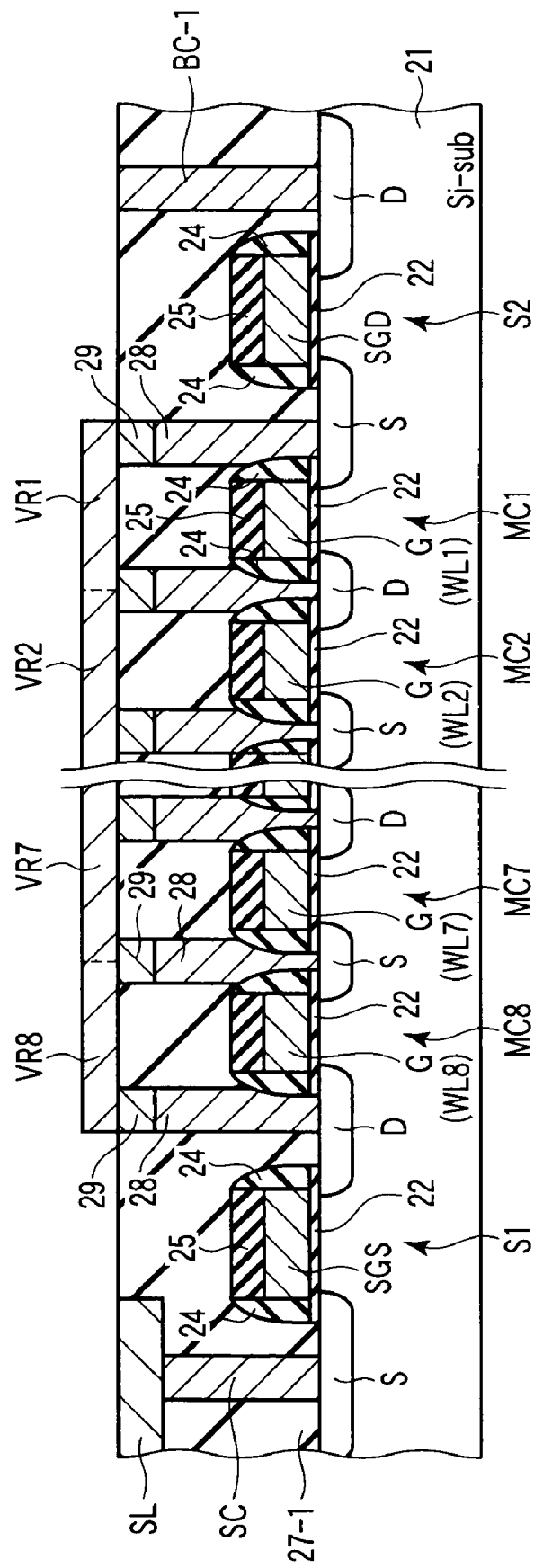
F I G. 13

_US 7,742,331 B2_

NONVOLATILE SEMICONDUCTOR MEMORY DEVICE AND DATA ERASE/WRITE METHOD THEREOF

CROSS-REFERENCE TO RELATED APPLICATIONS

This application is based upon and claims the benefit of priority from prior Japanese Patent Application No. 2007-087201, filed Mar. 29, 2007, the entire contents of which are incorporated herein by reference.

BACKGROUND OF THE INVENTION

1. Field of the Invention

The present invention relates to a nonvolatile semiconductor memory device and a data erase/write method thereof, and is applied, for example, to a ReRAM (resistive memory) using a variable resistor element in which a resistance value varies depending on the direction of a voltage that is applied.

2. Description of the Related Art

In recent years, studies have been made on the application of, e.g. a ReRAM (resistive memory) using a variable resistor element in which a resistance value varies depending on the direction of a voltage that is applied. As disclosed in, for instance, Jpn. Pat. Appln. KOKAI Publication No. 2004-272975 and S.Q. Liu, N. J. Wu, A. Ignatiev (App, Phy, Lett, 76, 19 (2000), such a phenomenon was found that when a voltage pulse is applied to a thin film, which becomes a variable resistor element, the resistance value of the thin film remarkably varies depending on the direction (sign) of the pulse voltage, and this phenomenon is applied to memories.

Jpn. Pat. Appln. KOKAI Publication No. 2004-272975 discloses an example of a nonvolatile semiconductor memory device using a variable resistor element. In the structure of KOKAI No. 2004-272975, however, only one select transistor (Si), which selects a series-connected memory cell section (memory cell string) (2), is provided in association with each series-connected memory cell section (2).

Thus, there is a tendency that the direction of the voltage that is to be applied to the variable resistor element cannot be changed, and data erase (reset) cannot be executed in units of the series-connected memory cell section (memory cell string) (2).

BRIEF SUMMARY OF THE INVENTION

According to an aspect of the present invention, there is provided a nonvolatile semiconductor memory device comprising: a memory cell array which includes a memory cell string including a plurality of memory cells each having a variable resistor element and a switching element having a current path with one end and the other end, between which the variable resistor element is connected, the plurality of memory cells having current paths thereof being connected in series, the memory cell array further including a first select element connected to one end of a current path of the memory cell string, and a second select element connected to the other end of the current path of the memory cell string; a bit line which is electrically connected to one end of a current path of the first select element; and a source line which is electrically connected to one end of a current path of the second select element.

According to another aspect of the present invention, there is provided a data erase/write method of a nonvolatile semiconductor memory device, comprising: selecting, at a time of data erase, first and second select elements which are connected to one end and the other end of a current path of a memory cell string in which current paths of a plurality of memory cells each having a switching element having a current path with one end and the other end, between which a variable resistor element is connected, are connected in series; and setting a direction of a voltage, which is applied between one end and the other end of the variable resistor element, to be opposite to a direction of a voltage which is applied between the one end and the other end of the variable resistor element at a time of a data write operation.

BRIEF DESCRIPTION OF THE SEVERAL VIEWS OF THE DRAWING

FIG. 13 is a cross-sectional view illustrating a fabrication step of the nonvolatile semiconductor memory device according to the first embodiment;

DETAILED DESCRIPTION OF THE INVENTION

Figure 1:
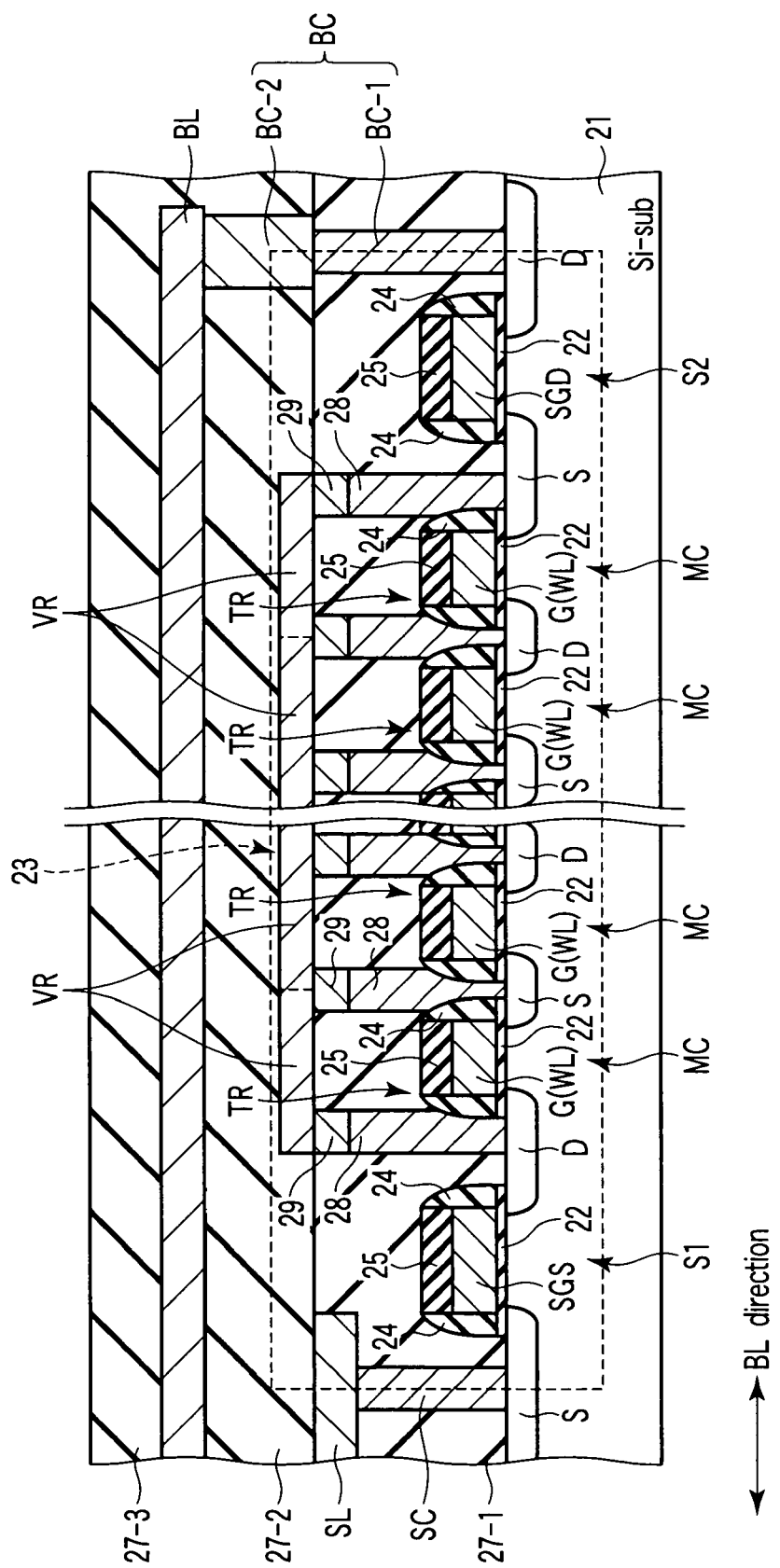
FIG. 1 is a cross-sectional view for describing a nonvolatile semiconductor memory device according to the outline of the present invention.

Embodiments of the present invention will now be described with reference to the accompanying drawings. In the description below, common parts are denoted by like reference numerals throughout the drawings.

[Outline]

To begin with, the outline of a nonvolatile semiconductor memory device according to the present invention is described with reference to FIG. 1 to FIG. 2.

In this example of the present invention, in order to enable a change of the direction of a voltage that is applied to a variable resistor element and to execute data erase (reset) in units of a memory cell string, there is proposed a nonvolatile semiconductor memory device which comprises a memory cell array including first and second select elements which are connected to one end and the other end of a current path of a memory cell string in which current paths of memory cells each having a variable resistor element and a switching element are connected in series; a bit line which is electrically connected to one end of the current path of the first select element; and a source line which is electrically connected to one end of the current path of the second select element.

Figure 2:
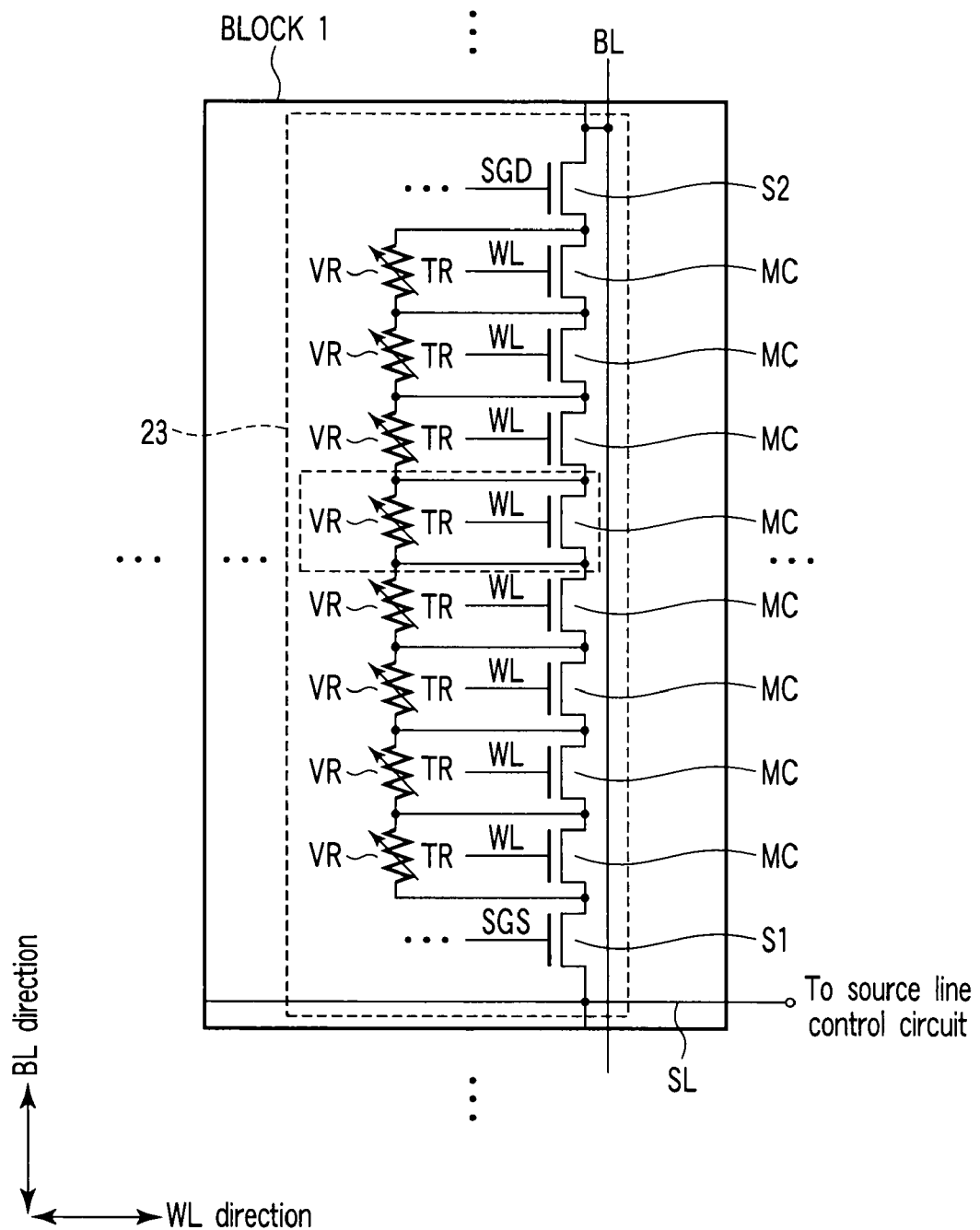
FIG. 2 is an equivalent circuit diagram for describing the nonvolatile semiconductor memory device according to the outline of the invention.

The structure of this nonvolatile semiconductor memory device is shown, for example, in FIG. 1 and FIG. 2. FIG. 1 is a cross-sectional view showing the nonvolatile semiconductor memory device, which is cut along a bit line direction (BL direction). FIG. 2 is an equivalent circuit diagram of the nonvolatile semiconductor memory device shown in FIG. 1.

As is shown in FIG. 2, the nonvolatile semiconductor memory device comprises a memory cell array 11 which is composed of a plurality of blocks, bit lines BL, and a source line SL.

A block BLOCK1, for instance, is composed of a plurality of memory cell strings 23 which are arranged plurality of memory cell units, and select transistors S1 and S2 (first and second select elements).

The memory cell unit MC has a plurality of a variable resistor element VR and a switching element TR. The variable resistor element VR is connected between one end and the other end of the current path of the switching element TR. The current paths of the plurality of memory cell units MC are connected in series.

As shown in FIG. 1, the switching element TR comprises a gate insulator film 22 provided on a semiconductor substrate (Si-sub) 21; a gate electrode G (WL) provided on the gate insulator film 22; a cap layer 25 provided on the gate electrode G; spacers 24 provided on side walls of the gate electrode G; and a source S and a drain D which are provided spaced apart in the substrate 21 so as to sandwich the gate electrode G. Thus, the switching element TR of the present example is a MOS transistor (metal oxide semiconductor transistor).

The variable resistor element VR is a resistor element whose resistance value varies depending on the direction of a voltage that is applied. The variable resistor element VR is formed of, e.g. a manganese-containing oxide having a perovskite-like crystal structure or an ordered double perovskite-like crystal structure, which exhibits colossal magnetoresistance or high-temperature superconductivity. In addition, there are binary metal oxides, such as $CuxO$, $NiO$ and $TiO_2$, which have characteristics of the ReRAM. Furthermore, aside from the ReRAM, a PRAM (Phase Change Memory) material, such as Ge—Sb—Te, may be used, a crystalline state and a non-crystalline state may be created by a current pulse flowing through a resistor element, and the change of resistance due to states can be utilized.

One end of the current path of the select transistor S1 is connected to one end of the current path of the memory cell units, and the other end of the current path of the select transistor S1 is connected to the source line SL via a source line contact SC.

One end of the current path of the select transistor S2 is connected to the other end of the serially connected memory cell units, and the other end of the current path of the select transistor S2 is connected to the bit line BL via bit line contacts BC-1 and BC-2.

As has been described above, the nonvolatile semiconductor memory device comprises the memory cell array 11 including first and second select transistors S1 and S2 which are connected to one end and the other end of the serially connected memory cell units MC the variable resistor element VR and switching element TR are connected in series; the bit line BL which is electrically connected to one end of the current path of the select transistor S2; and the source line which is electrically connected to one end of the current path of the select transistor S1.

Thus, according to this structure, at the time of a data erase operation, the select transistors S1 and S2 may be selected, and the direction of the voltage that is applied between the source line SL and bit line BL can be reversed, relative to the direction of the voltage that is applied between the source line SL and bit line BL at the time of a data write operation. Accordingly, the direction of the voltage that is applied to the variable resistor element VR at the time of data write and the direction of the voltage that is applied to the variable resistor element VR at the time of data erase can be reversed to each other. As a result, by taking advantage of the characteristics of the variable resistor element VR, data erase (reset) can be effected in each memory cell unit MC.

For example, in the case where data of a selected memory cell MC in the memory cell string 23 is to be erased, the direction of the voltage that is applied to the bit line BL and source line SL is reversed between the data write time and the data erase time. Thereby, data can be erased in units of the memory cell string 23.

On the other hand, in the case where data of a memory cell MC in the memory cell string 23 is not to be erased, for example, a voltage of a substantially equal magnitude is applied to the bit line BL and source line SL at the time of data erase, and no voltage difference is provided between the bit line BL and source line SL. Thereby, erroneous erase can be prevented.

Some embodiments of the invention, which are considered to be the best modes, will be described below. In the description below, common parts are denoted by like reference numerals throughout the drawings. In addition, in the following embodiments, a description is given of, by way of example, a nonvolatile semiconductor memory device using a variable resistor element in which the resistance value varies depending on a voltage that is applied.

First Embodiment

1. Entire Structure

Figure 3:
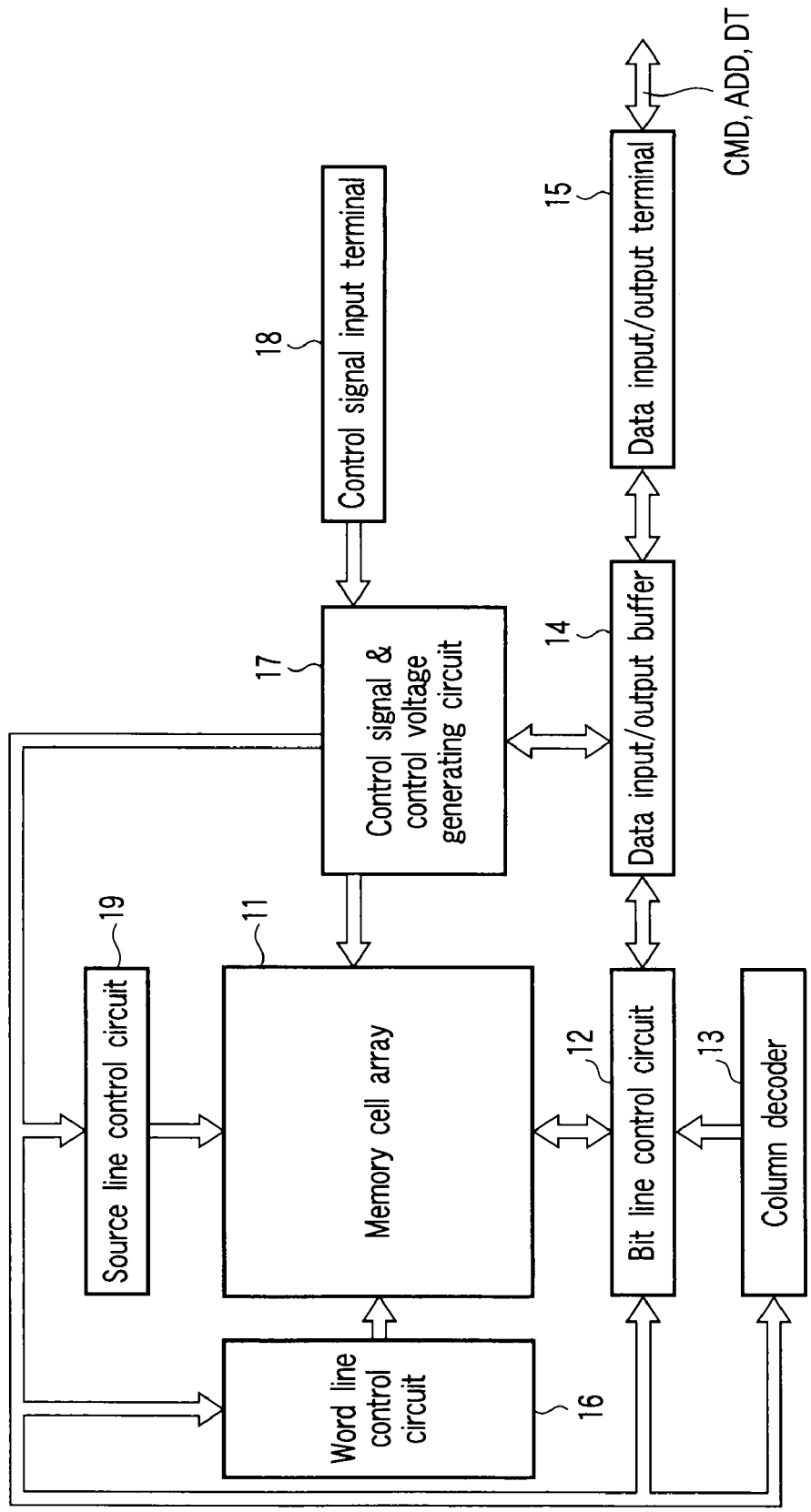
FIG. 3 is a block diagram showing the entire structure of a nonvolatile semiconductor memory device according to a first embodiment of the invention.

To begin with, referring to FIG. 3, a description is given of the entire structure of a nonvolatile semiconductor memory device according to a first embodiment of the present invention. FIG. 3 is a block diagram showing the nonvolatile semiconductor memory device according to this embodiment.

As shown in FIG. 3, the nonvolatile semiconductor memory device comprises a memory cell array 11, a bit line control circuit 12, a column decoder 13, a data input/output buffer 14, a data input/output terminal 15, a word line control circuit 16, a control signal & control voltage generating circuit 17, a control signal input terminal 18 and a source line control circuit 19.

The memory cell array 11 is composed of a plurality of blocks. The word line control circuit 16 for controlling word lines, the bit line control circuit 12 for controlling bit lines and the source line control circuit 19 for controlling the source line are connected to the memory cell array 11.

The bit line control circuit 12 reads data of memory cells in the memory cell array 11 via the bit lines, and detects the states of the memory cells in the memory cell array 11 via the bit lines. In addition, the bit line control circuit 12 executes data write in the memory cells by applying write control voltages to the memory cells in the memory cell array 11 via the bit lines. The column decoder 13 and the data input/output buffer 14 are connected to the bit line control circuit 12.

Data memory circuits (not shown) are provided in the bit line control circuit 12, and the data memory circuits are selected by the column decoder 13. The data of the memory cells, which are read into the data memory circuits, are output to the outside from the data input/output terminal 15 via the data input/output buffer 14. The data input/output terminal 15 is connected to, for example, a host device which is disposed outside the nonvolatile semiconductor memory device.

The host device is, for instance, a microcomputer, which receives data that is output from the data input/output terminal 15. Further, the host device outputs various commands CMD which control the operation of the nonvolatile semiconductor memory device, addresses ADD and data DT. Write data, which is input to the data input/output terminal 15 from the host device, is delivered via the data input/output buffer 14 to the data memory circuits (not shown) which are selected by the column decoder 13. On the other hand, the commands and addresses are delivered to the control signal & control voltage generating circuit 17.

The word line control circuit 16 selects the word lines in the memory cell array 11, and applies voltages necessary for data read, write or erase to the selected word lines.

The source line control circuit 19 selects the source line in the memory cell array 11, and applies voltages necessary for data read, write or erase to the selected source line.

The control signal & control voltage generating circuit 17 is connected to the memory cell array 11, bit line control circuit 12, column decoder 13, data input/output buffer 14, word line control circuit 16 and source line control circuit 19. These connected structural circuits are controlled by the control signal & control voltage generating circuit 17. The control signal & control voltage generating circuit 17 is connected to the control signal input terminal 18, and is controlled by control signals, such as an ALE (address latch enable) signal, which are input from the host device via the control signal input terminal 18.

The word line control circuit 16, bit line control circuit 12, column decoder 13, control signal & control voltage generating circuit 17 and source line control circuit 19 constitute a write circuit and a read circuit.

2. Example of the Structure of the Block

Figure 4:
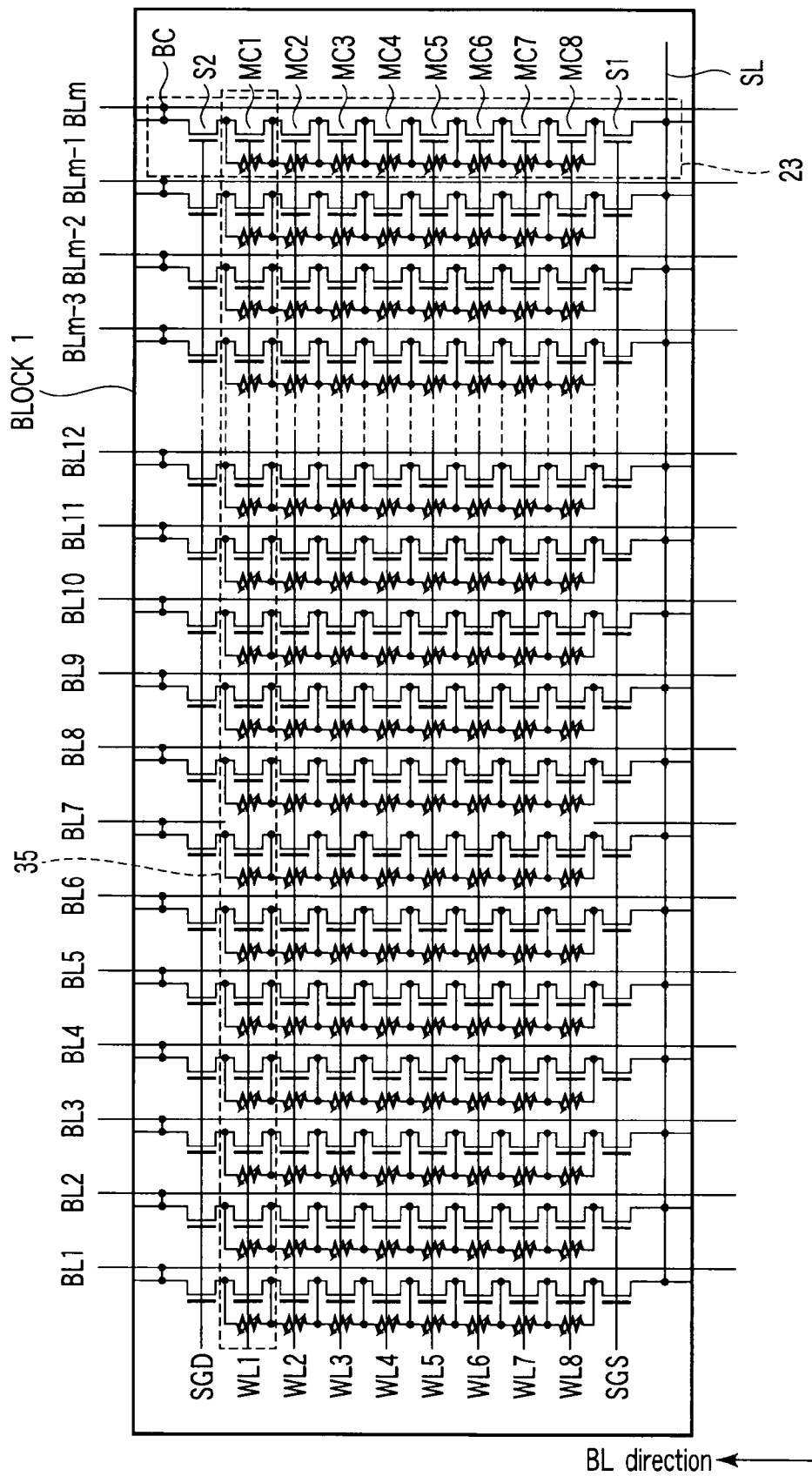
FIG. 4 is an equivalent circuit diagram showing a block of the nonvolatile semiconductor memory device according to the first embodiment.

Next, an example of the structure of blocks, which constitute the memory cell array 11, is described with reference to FIG. 4. In this description, one block BLOCK1 is exemplified.

The block BLOCK1 is composed of a plurality of memory cell strings 23 which are arranged in the word line direction (WL direction).

The memory cell string 23 is for example, composed of eight memory cell units MC1 to MC8 and select transistor S1 and S2, and source line SL and bit line contact BC.

The select transistor S1 is connected to one end of the current path of the serially connected memory cell units.

The select transistor S2 is connected to the other end of the current path of serially connected memory cell units.

In this example, the memory cell string 23 has composed of eight memory cells MC. However, the memory cell string 23 may have composed of two or more memory cells, and the number of memory cells is not limited to eight.

The other end of the current path of the select transistor S2 is connected to a bit line BLm, and the other end of the current path of the select transistor S1 is connected to a source line SL. The source line SL is shared between two blocks neighboring in the bit line direction.

Word lines WL1 to WL8 extend in the WL direction, and are commonly connected to gate electrodes of a plurality of memory cell units which are arranged in the WL direction. A select gate SGD extends in the WL direction, and is commonly connected to a plurality of select transistors S2 which are arranged in the WL direction. Similarly, a select gate SGS extends in the WL direction, and is commonly connected to a plurality of select transistors S1 which are arranged in the WL direction.

A page 35 is present in each of the word lines WL1 to WL8. For example, as indicated by a broken-line box in FIG. 4, a page 35 is present in the word line WL1. Since a data read operation is executed in units of the page 35, the page 35 is a data read unit.

Figure 5:
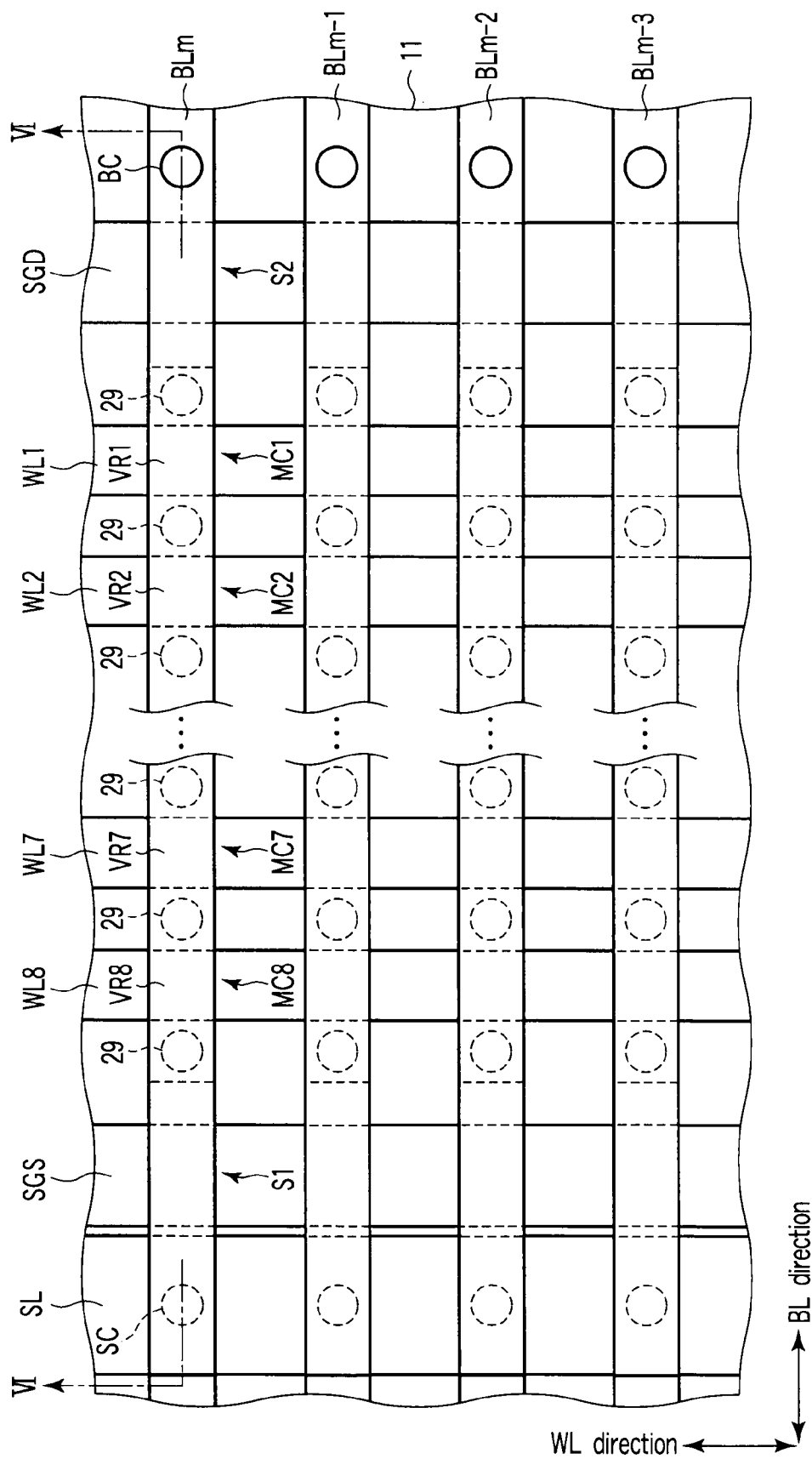
FIG. 5 is a plan view showing the nonvolatile semiconductor memory device according to the first embodiment.
Figure 6:
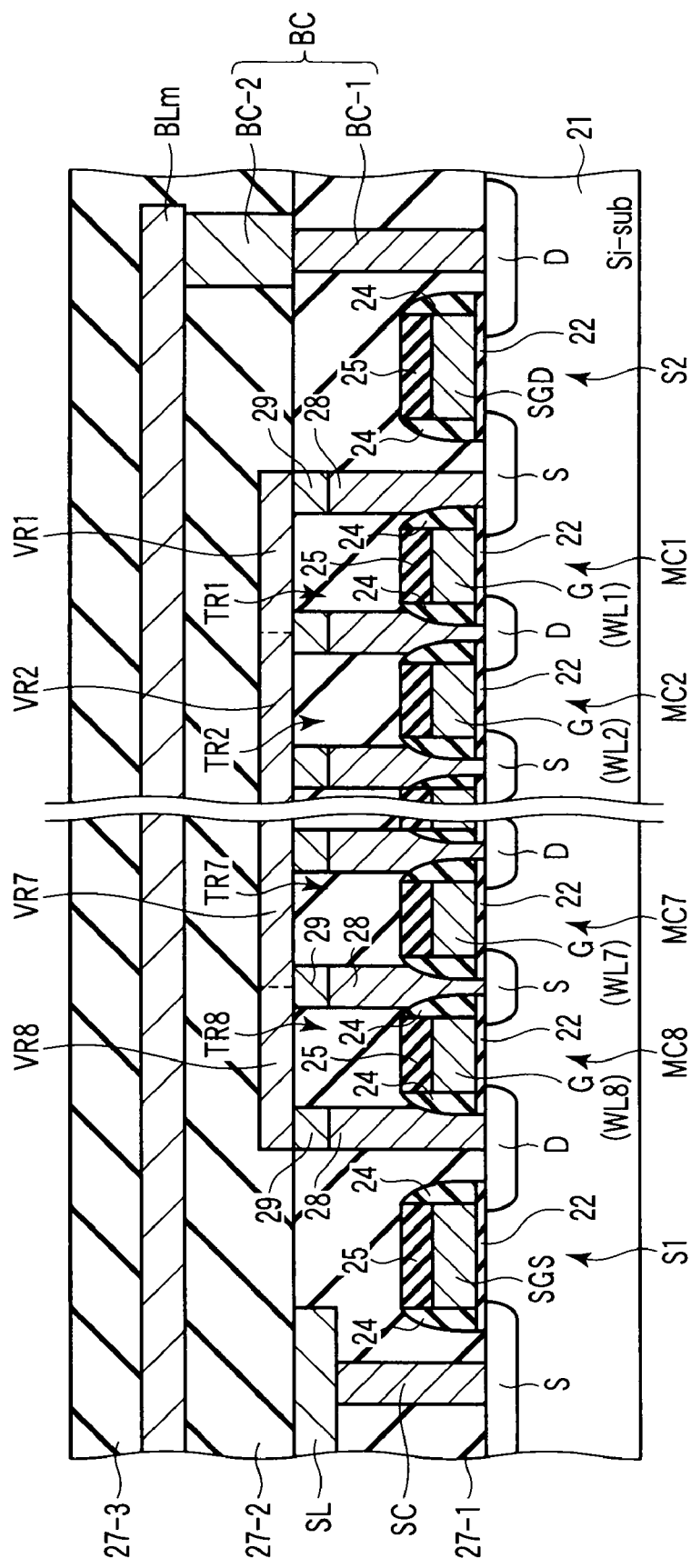
FIG. 6 is a cross-sectional view taken along line VI-VI in FIG. 5.
Figure 7:
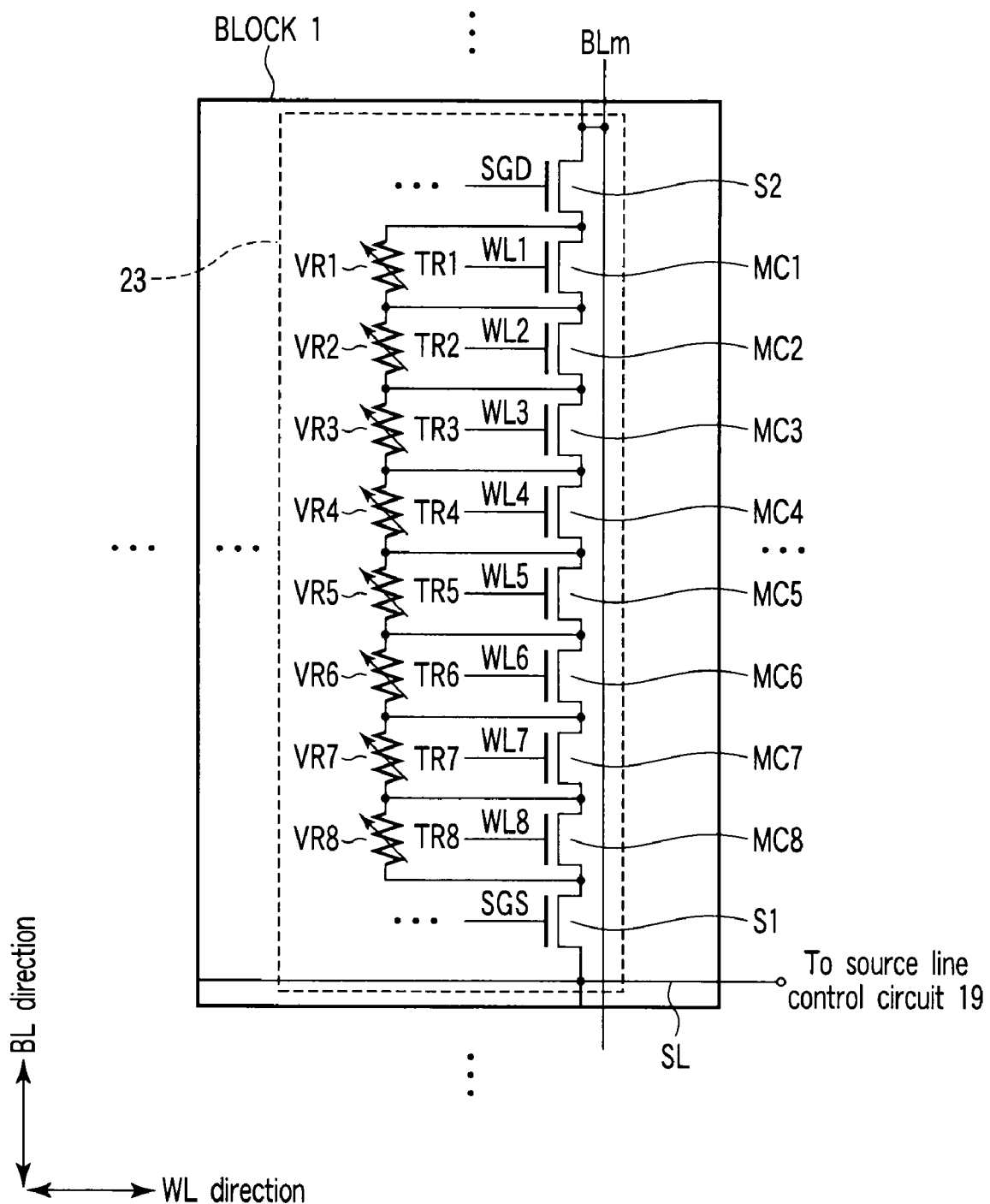
FIG. 7 is an equivalent circuit diagram showing the nonvolatile semiconductor memory device according to the first embodiment.

3. An Example of Plan-View Structure, an Example of Cross-Sectional Structure in the Bit Line Direction, and an Equivalent Circuit Thereof Next, an example of plan-view structure, an example of cross-sectional structure in the bit line direction and an equivalent circuit thereof are described with reference to FIG. 5 to FIG. 7. FIG. 5 is a plan view showing the memory cell array of the nonvolatile semiconductor memory device according to the present embodiment. FIG. 6 is a cross-sectional view taken along line VI-VI in FIG. 5. FIG. 7 is an equivalent circuit diagram showing the nonvolatile semiconductor memory device shown in FIG. 6. In this description, memory cells MC1 to MC8 and select transistors S1 and S2, which are commonly connected to the bit line BLm in FIG. 5, are exemplified.

As is shown in FIG. 5 and FIG. 6, the memory cell string 23 has a plurality of memory cell units MC1 to MC8 each having a variable resistor element, VR1 to VR8, and a switching element, TR1 to TR8, the variable resistor element, VR1 to VR8, being connected between one end S and the other end D of the current path of the switching element. The current paths of the plurality of memory cell units MC1 to MC8 are connected in series.

Each of the memory cell units MC includes a variable resistor element VR and a switching element TR connected in parallel. In other words, when the current paths of memory cells MC1 to MC8 are connected in series, the current paths of the switching elements TR and the current paths of the variable resistor elements VR are connected in series. As can be understood from this, the variable resistor elements VR of the memory cells MC1 to MC8 are arranged in a line extending in parallel to the major surface of the semiconductor substrate 21.

The resistance value of each of the variable resistor element VR1 to VR8 varies depending on the direction of a voltage that is applied. The variable resistor element, VR1 to VR8, is formed of, e.g. a manganese-containing oxide having a perovskite-like crystal structure or an ordered double perovskite-like crystal structure, which exhibits colossal magnetoresistance or high-temperature superconductivity. To be more specific, the variable resistor element is formed of, for instance, $Pr(1-x)Ca_xMnO_3$, $La(1-x)Ca_xMnO_3$, $Nd(1-x)Sr_xMnO_3 (0<x<1)$, $Sr_2FeMoO_6$, or $Sr_2FeWO_6$. Other examples are metal oxides of Ni, Ti or Cu, metal oxides such as $SrTiO_3$, and such metal oxides doped with impurities such as Nb.

The switching element, TR1 to TR8, comprises a gate insulator film 22 provided on a semiconductor substrate (Si-sub) 21; a gate electrode G provided on the gate insulator film 22; a cap layer 25 provided on the gate electrode G; spacers 24 provided on side walls of the gate electrode G; and a source S and a drain D which are provided spaced apart in the substrate 21 so as to sandwich the gate electrode G. The switching elements TR1 to TR8 have their sources and drains shared.

One end of the current path of the select transistor S1 is connected to one end of the current path of serially connected memory cell units, and the other end of the current path of the select transistor S1 is connected to the source line SL via a source line contact SC. The select transistor S1 comprises a gate insulator film 22 provided on the semiconductor substrate 21; a select gate SGS provided on the gate insulator film 22; a cap layer 25 provided on the select gate SGS; spacers 24 provided on side walls of the select gate SGS; and a source S and a drain D which are provided spaced apart in the substrate 21 so as to sandwich the select gate SGS.

One end of the current path of the select transistor S2 is connected to the other end of the current path of the serially connected cell units, and the other end of the current path of the select transistor S2 is connected to the bit line BL via bit line contacts BC-1 and BC-2. The select transistor S2 comprises a gate insulator film 22 provided on the semiconductor substrate 21; a select gate SGD provided on the gate insulator film 22; a cap layer 25 provided on the select gate SGD; spacers 24 provided on side walls of the select gate SGD; and a source S and a drain D which are provided spaced apart in the substrate 21 so as to sandwich the select gate SGD.

An equivalent circuit of the structure shown in FIG. 6 is as shown in FIG. 7.

4. Data Write Operation

Next, a data write operation of the nonvolatile semiconductor memory device according to the present embodiment is described with reference to FIG. 8 and FIG. 9. In this description, a memory cell string 23-*m* shown in FIG. 8 is exemplified as a memory cell string in which data write is executed, and a memory cell string 23-1 shown in FIG. 9 is exemplified as a memory cell string in which data write is not executed.

Figure 8:
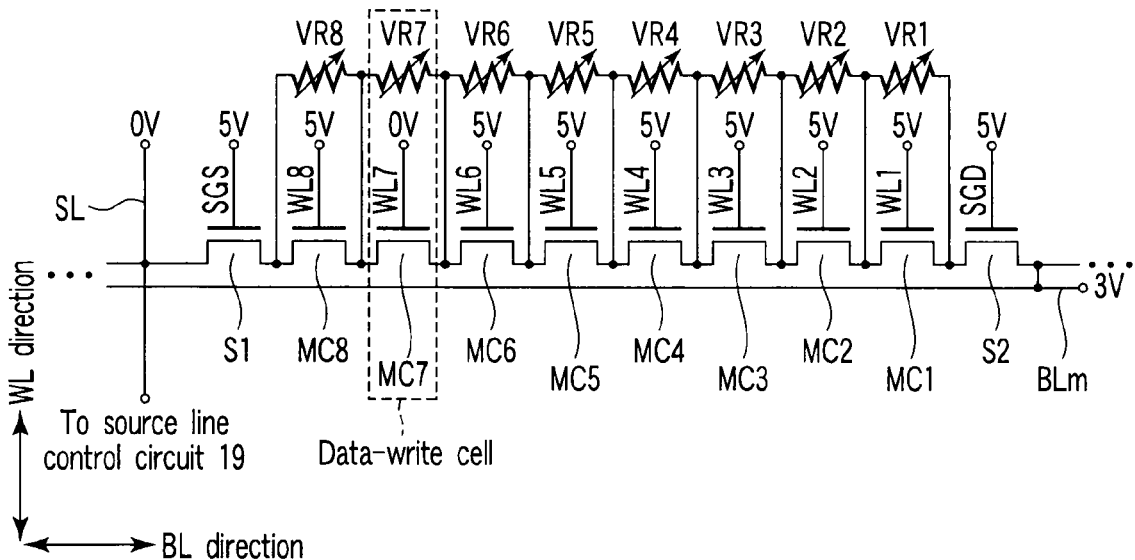
FIG. 8 is a circuit diagram for explaining a write operation of the nonvolatile semiconductor memory device according to the first embodiment.
Figure 9:
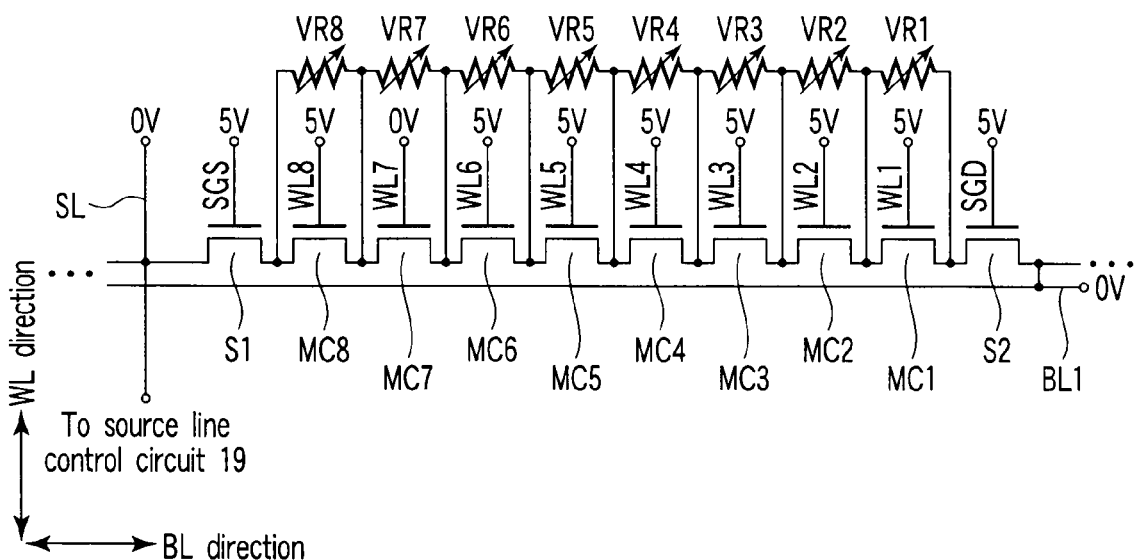
FIG. 9 is a circuit diagram for explaining a write operation of the nonvolatile semiconductor memory device according to the first embodiment.

To begin with, referring to FIG. 8, a write operation of the data-write memory cell string 23-*m* is described. In this example, data is written in the memory cell MC7 which is connected to the bit line BLm.

As shown in FIG. 8, in accordance with the control by the source line control circuit 19, a voltage of, e.g. about 0V is applied to the source line SL. In accordance with the control by the bit line control circuit 12, a voltage of, e.g. about 3V is applied to the bit line BLm. In accordance with the control by the word line control circuit 16, a voltage lower than a threshold voltage (e.g. about 1V), e.g. about 0V, is applied to the selected word line WL7, and the switching element is turned off. In addition, in accordance with the control by the word line control circuit 16, a voltage higher than the sum of the threshold voltage (about 1V) and the bit line voltage (about 3V), for example, about 5V, is enough to turn on unselected word lines WL1 to WL6 and WL8.

With this relationship of voltages, the voltage of the bit line BLm can be uniformly transferred to the variable resistor element VR7 of the data-write memory cell MC7. As a result, the resistance value of the variable resistor element VR7 varies, and data write can be executed in the data-write memory cell MC7.

Next, referring to FIG. 9, a description is given of the operation of a non-data-write memory cell string 23-1, which is included in the block that includes the above-described data-write memory cell string 23-*m*. In this description, the memory cell string 23-1, which is connected to the bit line BL1, is exemplified.

The non-data-write memory cell string 23-1 differs from the data-write memory cell string 23-*m* in that in accordance with the control by the bit line control circuit 12, the voltage that is applied to the non-selected bit line BL1 is set at the same voltage, e.g. about 0V, as the voltage applied to the source line SL. In this manner, by setting the voltage, which is applied to the non-selected bit line BL1, to be equal to the voltage applied to the source line SL, both ends of the variable resistor elements VR1 to VR8 of the non-selected memory cells are set at the same voltage, and no data write is executed in the memory cell string 23-1.

As has been described above, as regards the non-data-write memory cell string 23-1 which includes no data-write cell, the voltage that is applied to the non-selected bit line BL1 is set at the same voltage as the voltage applied to the source line SL, e.g. about 0V. As there is no voltage difference across the variable resistors, erroneous write can be prevented. At this time, the voltage that is applied to the drain-side select gate SGD and source-side select gate SGS may, basically, be set at any voltage higher than the threshold voltage. By applying the voltage, to the select gates SGD and SGS select transistors S1 and S2 turn on, and both ends of the variable resistor elements VR1 to VR8 can be short-circuited and held at 0V.

5. Data Erase Operation

Next, a data erase operation of the nonvolatile semiconductor memory device according to the present embodiment is described with reference to FIG. 10 and FIG. 11. In this description, a data-erase memory cell string 23-*m* shown in FIG. 10 is exemplified as a memory cell string in which data erase is executed, and a non-data-erase memory cell string 23-1 shown in FIG. 11 is exemplified as a memory cell string in which data erase is not executed.

Figure 10:
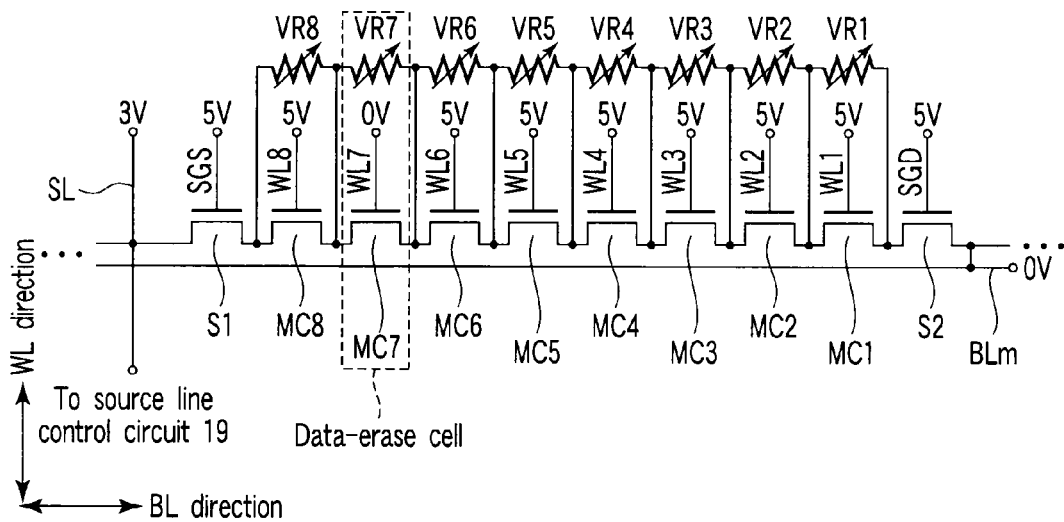
FIG. 10 is a circuit diagram for explaining an erase operation of the nonvolatile semiconductor memory device according to the first embodiment.
Figure 11:
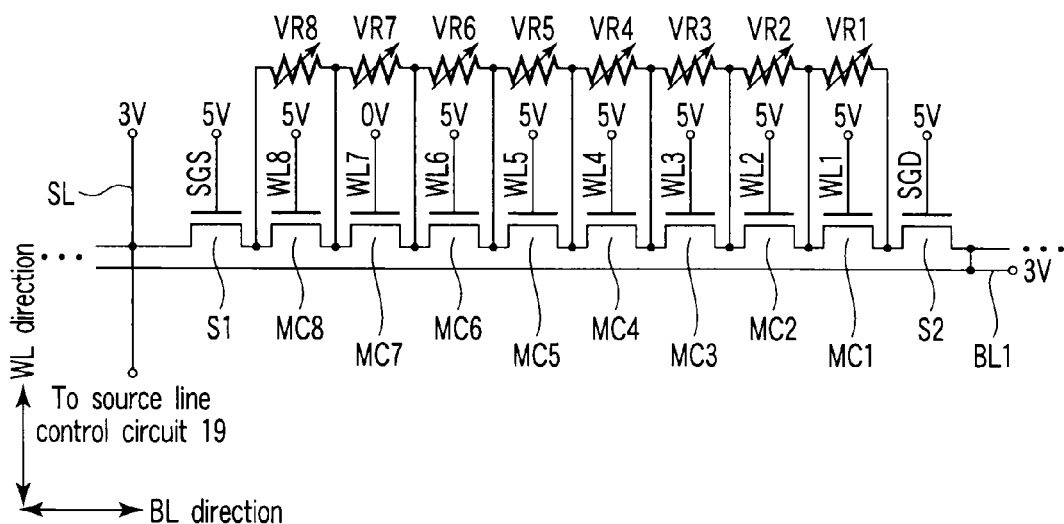
FIG. 11 is a circuit diagram for explaining an erase operation of the nonvolatile semiconductor memory device according to the first embodiment.

To begin with, referring to FIG. 10, an erase operation of the data-erase memory cell string 23-*m* is described. In this example, data of the memory cell MC7, which is connected to the bit line BLm, is erased.

As shown in FIG. 10, in the data-erase memory cell string 23-m, in accordance with the control by the source line control circuit 19, a voltage higher than the voltage applied to the bit line BLm, for example, a voltage of about 3V, is applied to the source line SL. In accordance with the control by the word line control circuit 16, a voltage of about 0V is applied to the word line WL7 of the data-erase cell MC7, and the switching element is turned off. In addition, in accordance with the control by the word line control circuit 16, a voltage higher than the sum of the voltage of the bit line voltage BLm (about 3V) and the threshold voltage (about 1V), for example, about 5V, is enough to turn on the word lines WL1 to WL6 and WL8 of the unselected cells MC1 to MC6 and MC8. In accordance with the control of the bit line control circuit 12, a voltage of about 0V is applied to the bit line BLm.

With this relationship of voltages, a voltage in a direction substantially opposite to the direction of voltage at the time of the above-described data write can be applied to the variable resistor element VR7 of the data-erase cell MC7. Thus, data erase can be executed in the data-erase cell MC7.

Next, referring to FIG. 11, a description is given of the operation of a non-data-erase memory cell string 23-1. In this description, the memory cell string 23-1, which is connected to the bit line BL1, is exemplified.

The non-data-erase memory cell string 23-1 differs from the data-erase memory cell string 23-m in that in accordance with the control by the bit line control circuit 12, the same voltage as is applied to the source line SL, for example, a voltage of about 3V, is applied to the non-selected bit line BL1. With this relationship of voltages, there is no voltage difference between the source line SL and bit line BL1, and data erase is not executed.

<Control Methods of Other Data Write Operation and Data Erase Operation>

As has been described above, in the present embodiment, in the data write operation and data erase operation, the common voltage is applied to the source line SL of the memory cell string 23-m, 23-1, and the voltage that is applied to the bit line BLm, BL1 is controlled by the bit line control circuit 12. With this control, the write operation and erase operation can be controlled individually in association with each memory cell string.

The method of control is not limited to this. In the write operation and erase operation, a common voltage may be applied to the bit line BLm, BL1 of the memory cell string, and the voltage that is applied to the source line SL may be controlled. In this case, since the source line SL cannot independently be controlled in two blocks which neighbor in the bit line direction and share the source line SL, the erase operation cannot independently be controlled in each of the blocks. Thus, in the case where the source line SL is commonly shared, in accordance with the control by the word line control circuit 16, the voltage that is applied to the source-side select gate SGS is set at a voltage lower than the threshold voltage, for example, at about 0V, thereby turning off the select transistor S1 and disconnecting the select transistor S1 from the source line SL. Thereby, the erase operation can be controlled independently in association with each block.

The unit of the erase operation is not limited to the memory cell string 23 or the block, as described above. Alternatively, a unit of plural cells can be erased at the same time. The reason for this is that in the variable resistor elements VR1 to VR8 of the present embodiment, data write/erase is not executed by supplying an electric current as in the case of, e.g. an MRAM (Magnetic Random Access Memory), but data write/erase is executed on the basis of the direction of voltage application.

For example, a unit of word lines WL1 to WL8 may be erased at the same time. In this case, to begin with, in accordance with the control of the bit line control circuit 12, a voltage of, e.g. about 0V is applied to the bit lines BL1 to BLm, and the bit lines BL1 to BLm are all selected. Then, in accordance with the control of the word line control circuit 16, a voltage of, e.g. about 0V is applied to the word lines WL1 to WL8, and the word lines WL1 to WL8 are all selected, and the same erase operation as described above is executed. Thereby, the unit of word lines WL1 to WL8, in other words, all of a block can be erased, at the same time.

More preferably, flash erase may be executed. In this case, for example, it is thinkable to execute control to apply a voltage of about 0V to all bit lines in the chip, to apply a voltage of about 3V to all source lines, to apply a voltage of about 5V to all select gates SGS and SGD, and to apply a voltage of about 0V to all word lines. All of the cells on a chip can be erased at the same time.

6. Manufacturing Method

Next, a method of manufacturing the nonvolatile semiconductor memory device according to the present embodiment is described with reference to FIG. 12 and FIG. 13. In this description, the nonvolatile semiconductor memory device shown in FIG. 6, which is cut along the bit line direction, is exemplified.

Figure 12:
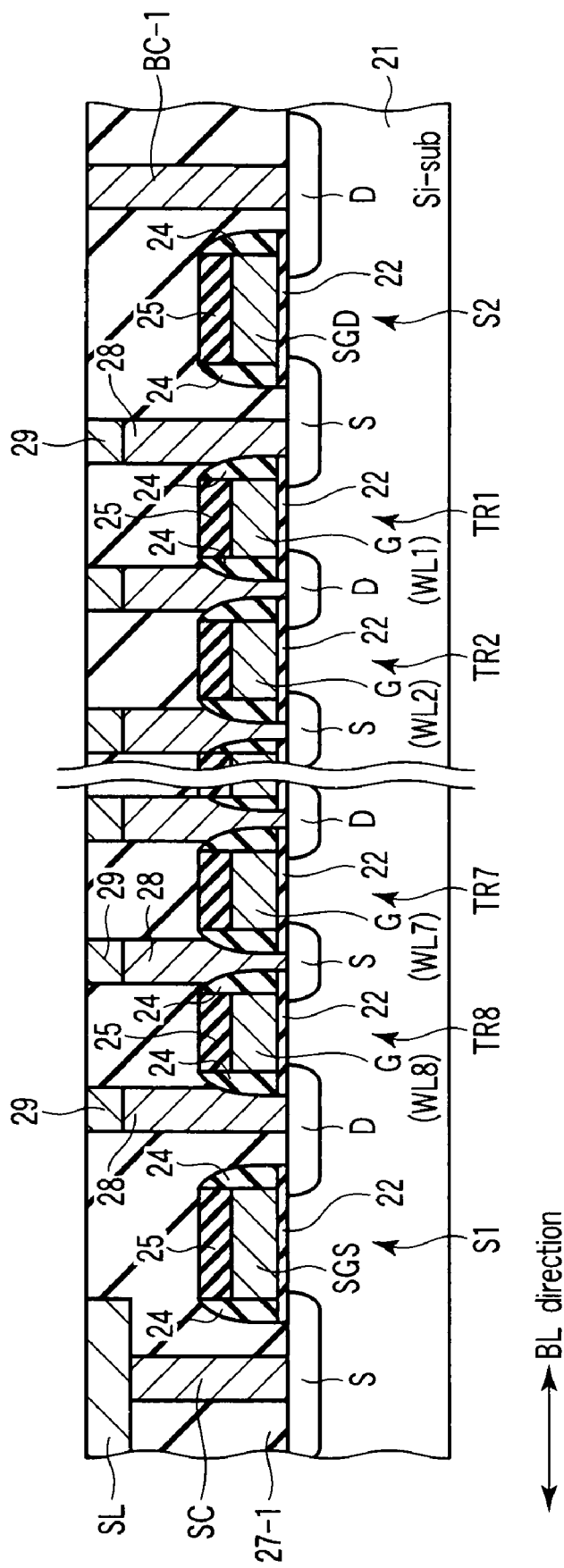
FIG. 12 is a cross-sectional view illustrating a fabrication step of the nonvolatile semiconductor memory device according to the first embodiment.

To start with, as shown in FIG. 12, using well-known fabrication steps, select transistors S1 and S2 and switching elements TR1 to TR8 are formed on a semiconductor substrate 21. In this case, a cap layer 25 of, e.g. SiN is formed on the gate electrode G. In addition, spacers 24 of, e.g. SiN are formed on side walls of the gate electrode G.

Subsequently, contact holes are formed by anisotropic etching, such as RIE (Reactive Ion Etching), in those portions of an interlayer insulator film 27-1, which correspond to regions over the sources S/drains D of the select transistors S1, S2 and switching elements TR1 to TR8. At this time, the cap layer 25 and spacers 24 are formed of a material such as SiN, which has selectivity relative to the material (e.g. $SiO_2$) of which the interlayer insulator film 27-1 is formed. Thereby, in the step of forming the contact holes, short-circuit with the gate electrode G can be prevented.

Subsequently, tungsten (W), for instance, is buried in the contact holes by, e.g. CVD (Chemical Vapor Deposition), and contact filling 28, a bit line contact BC-1 and a source line contact SC are formed.

Upper portions of the contact filling 28 of the switching elements TR1 to TR8 are selectively etched back by anisotropic etching such as RIE.

On the etched-back contact filling 28, an electrode material, such as platinum (Pt), is deposited by, e.g. CVD. Then, using, e.g. RIE or CMP (Chemical Mechanical Polishing), the electrode material is left on the etched-back contact filling 28, and electrodes 29 are formed. Other usable materials of the electrodes 29 are, for instance, metals such as Ag, Ru, Au, Cu and Ti, and metal oxides such as $LaCoO_3$ and $YBa_2Cu_3Ox$ (YBCO). In some cases, a barrier metal for preventing an interaction or diffusion is formed, as needed, at a boundary between the contact filling 28 and the electrode 29. If the covering performance of the material of the electrode 29 is good, the contact filling 28 may not be used, and the electrode 29 and, where necessary, a barrier metal may be buried.

Subsequently, using a well-known fabrication step, a source line SL is formed on the source line contact SC.

Following the above step, as shown in FIG. 13, on the thus formed structure, a variable resistor material is formed, by, e.g. CVD, of, e.g. a manganese-containing oxide having a perovskite-like crystal structure or an ordered double perovskite-like crystal structure, which exhibits colossal magnetoresistance or high-temperature superconductivity. To be more specific, examples of the variable resistor material are $Pr(1-x)Ca_xMnO_3$, $La(1-x)Ca_xMnO_3$, $Nd(1-x)Sr_xMnO_3$ ($0<x<1$), $Sr_2FeMoO_6$, and $Sr_2FeWO_6$. Other examples are metal oxides of Ni, Ti or Cu, metal oxides such as $SrTiO_3$, and such metal oxides doped with impurities such as Nb.

The variable resistor material is selectively left on the switching elements TR1 to TR8 in stripes, and variable resistors VR1 to VR8 are formed. Thus, memory cells MC1 to MC8 are formed.

Thereafter, using well-known fabrication steps, interlayer insulator films 27-2 and 27-3, a bit line contact BC-2 and a bit line BL are formed, and the nonvolatile semiconductor memory device shown in FIG. 6 is manufactured.

7. Advantageous Effects of the Present Embodiment

At least the following advantageous effects (1) to (3) are obtained by the nonvolatile semiconductor memory device according to the present embodiment, the data erase/write method thereof, and the manufacturing method thereof.

(1) The direction of a voltage that is applied to the variable resistor element, VR1 to VR8, can be changed, and data erase (reset) can be executed in units of the memory cell string 23.

As has been described above, the nonvolatile semiconductor memory device according to the present embodiment comprises the memory cell array 11 including first and second select transistors S1 and S2 which are connected to one end and the other end of the current path of serially connected memory cells MC1 to MC8 each having the variable resistor element, VR1 to VR8, and switching element, TR1 to TR8, are connected in series; the bit line BL which is electrically connected to one end of the current path of the select transistor S2; and the source line SL which is electrically connected to one end of the current path of the select transistor S1.

Thus, as has been described with reference to FIG. 8 to FIG. 11, at the time of a data erase operation, the select transistors S1 and S2 may be selected, and the direction of the voltage that is applied between the source line SL and bit line BL can be reversed, relative to the direction of the voltage that is applied between the source line SL and bit line BL at the time of a data write operation. Accordingly, the direction of the voltage that is applied to the variable resistor element, VR1 to VR8, at the time of data write and the direction of the voltage that is applied to the variable resistor element, VR1 to VR8, at the time of data erase can be reversed to each other. As a result, by taking advantage of the characteristics of the variable resistor elements VR1 to VR8, data erase (reset) can be effected in units of each memory cell string 23.

Figure 14:
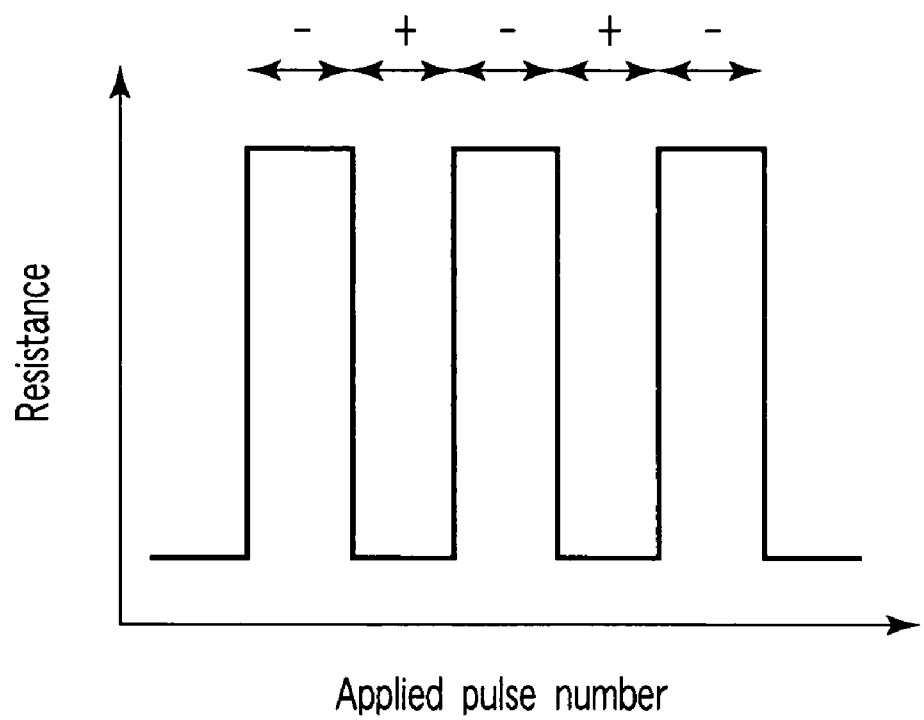
FIG. 14 is a graph showing the relationship between the sign of an application voltage, which is applied to a variable resistor element, and a resistance value.

FIG. 14 shows the relationship between the direction (sign) of an application voltage and a resistance value, for example, in a case where $Pr_{0.7}Ca_{0.3}MnO_3$ is used for the variable resistor elements VR1 to VR8. As shown in FIG. 14, the direction (sign) of the voltage that is applied to the variable resistor element, VR1 to VR8, at the time of data write and the direction (sign) of the voltage that is applied to the variable resistor element, VR1 to VR8, at the time of data erase are reversed to each other. Thereby, the resistance value can be varied. Accordingly, data erase (reset) can be effected in units of each memory cell string 23.

(2) The reliability can be enhanced.

For example, in the structure disclosed in Jpn. Pat. Appln. KOKAI Publication No. 2004-272975, only one select transistor (Si), which selects a serially connected memory cell section (2), is provided in association with each serially connected memory cell section (2). In this case, the reliability lowers due to the following first to third tendencies.

As a first tendency, it should be noted that the erasure of a memory cell is executed by applying the memory cell with a reverse voltage to that applied when data is written therein. To apply the voltage reverse to that of the write mode in the configuration disclosed in Jpn. Pat. Appln. KOKAI Publication No. 2004-272975, the source lines are set at Vss, and the bit lines are applied with a negative voltage. Assume that the voltage relationship shown in FIG. 10 of the present application is used so as to prevent a negative voltage from being applied to the bit lines. In this case, even if select transistor S2 connected to the bit lines BL of non-data-erase memory cell string is closed, the charging current supplied to source lines SL erases data from the non-data-erase memory cell string.

As a second tendency, it should be noted that a switching transistor made of an N-channel transistor may not operate. When the bit lines are applied with a negative voltage of, e.g., −5V, the P-type substrate and the drain diffusion layer are applied with a forward bias. Since this causes short circuiting, a large current flows, with the result that the switching transistor does not operate.

In contrast, the nonvolatile semiconductor memory device of the present invention comprises select transistors S1 and S2 at the respective ends of the current path of memory cell strings 23. With this feature, even if a positive voltage is applied to the source lines SL, no data is erased from the non-data-erase memory cell string. Accordingly, it is not necessary to apply a negative voltage to the bit lines.

Since the first and second tendencies described above do not become a problem, the reliability is enhanced.

By contrast, in the nonvolatile semiconductor memory device according to the present embodiment, the select transistor S1 and select transistor S2 are provided at both ends of the current path of the memory cell string 23.

Therefore, the above-described first to third tendencies do not occur, and the reliability can advantageously be enhanced.

(3) The number of fabrication steps can be decreased, and the manufacturing cost can be reduced.

As has been described with reference to FIG. 12, the contact wiring lines 28 and electrodes 29 are buried in the trenches (contact holes) formed in the interlayer insulator film 27-1, and are thus formed. Accordingly, there is no need to form a complex multilayer structure, and memory cells MC1 to MC8 with small cell areas can be formed by a short process.

Therefore, the number of fabrication steps can be decreased, and the manufacturing cost can advantageously be reduced.

Second Embodiment

Another Example of the Structure of the Memory Cells

Figure 15:
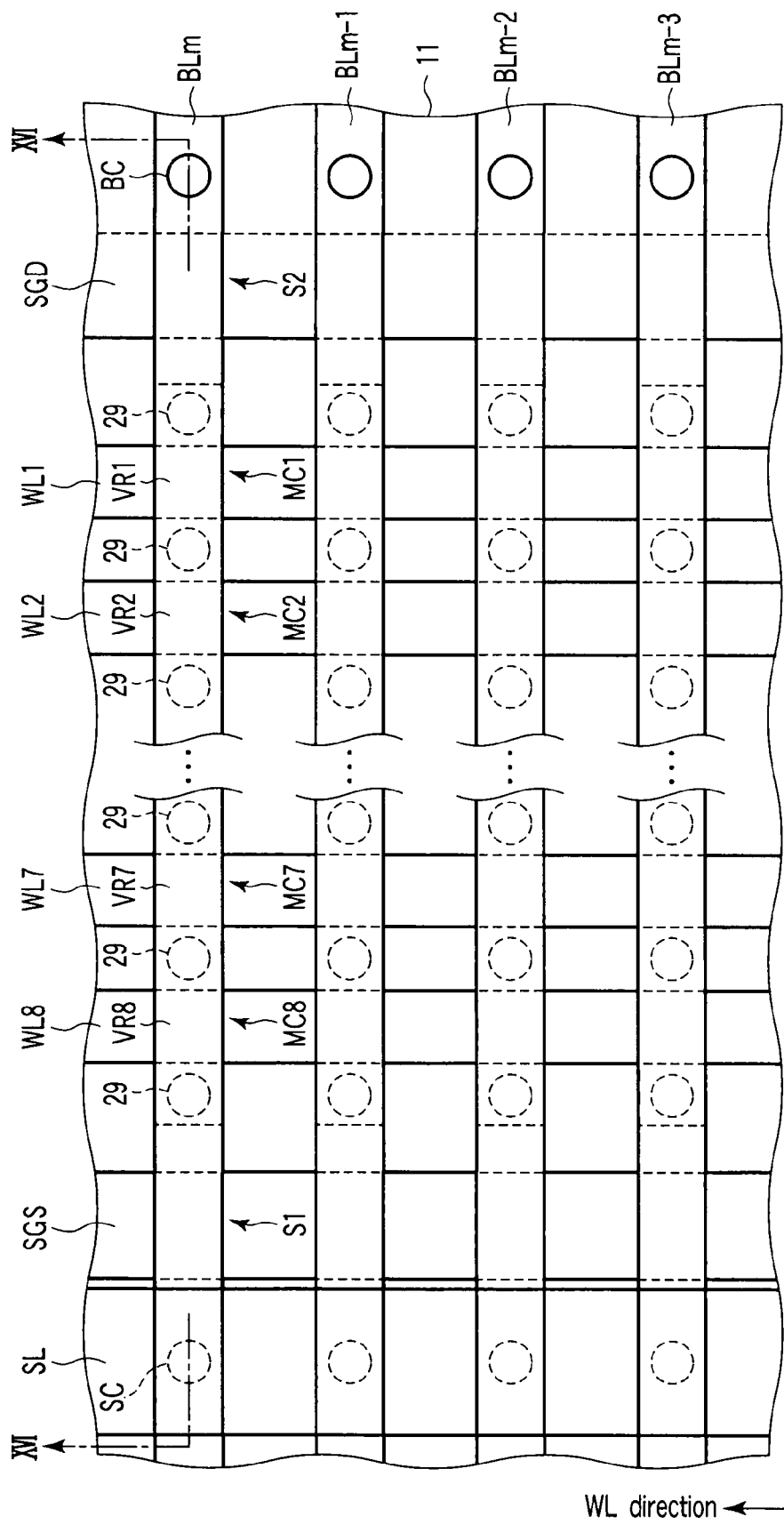
FIG. 15 is a plan view showing a nonvolatile semiconductor memory device according to a second embodiment of the present invention.
Figure 16:
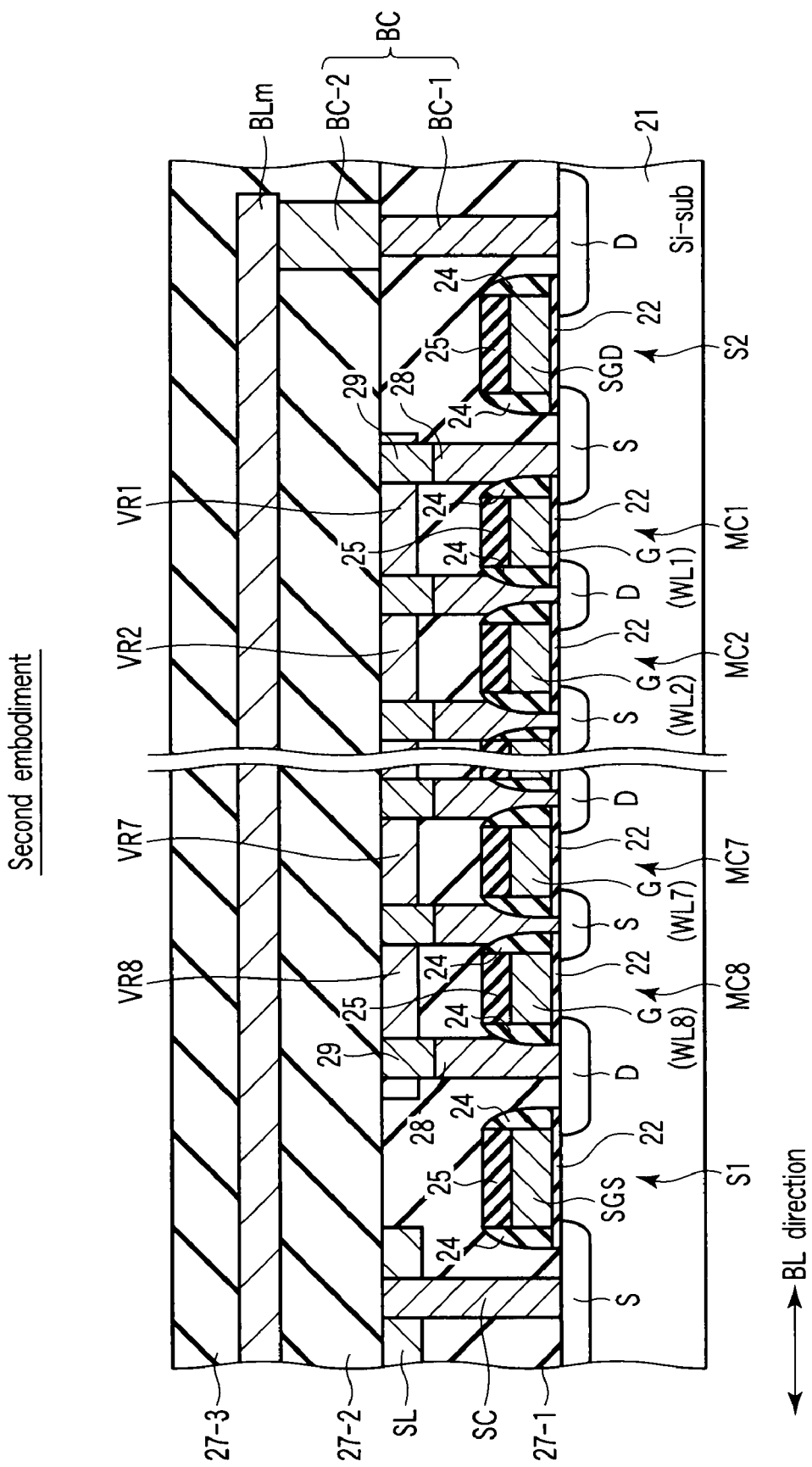
FIG. 16 is a cross-sectional view taken along line XVI-XVI in FIG. 15.

Next, the structure of a nonvolatile semiconductor memory device according to a second embodiment of the invention is described with reference to FIG. 15 and FIG. 16. This embodiment relates to another example of the structure of the memory cells. FIG. 15 is a plan view showing a nonvolatile semiconductor memory device according to this embodiment. FIG. 16 is a cross-sectional view taken along line XVI-XVI in FIG. 15. A detailed description of the parts common to those in the first embodiment is omitted here.

<Structure Example>

As shown in FIG. 16, the nonvolatile semiconductor memory device of the second embodiment differs from that of the first embodiment in that variable resistor elements VR1 to VR8 are buried in the interlayer insulator film 27-1. The depth of the trench in which the variable resistor element, VR1 to VR8, is buried is set to be shallower than the depth of the trench in which the electrode 29 is buried.

The operation is common to the first embodiment, so a detailed description is omitted here.

<Manufacturing Method>

Next, a method of manufacturing the nonvolatile semiconductor memory device according to the present embodiment is described with reference to FIG. 17 and FIG. 18.

Figure 17:
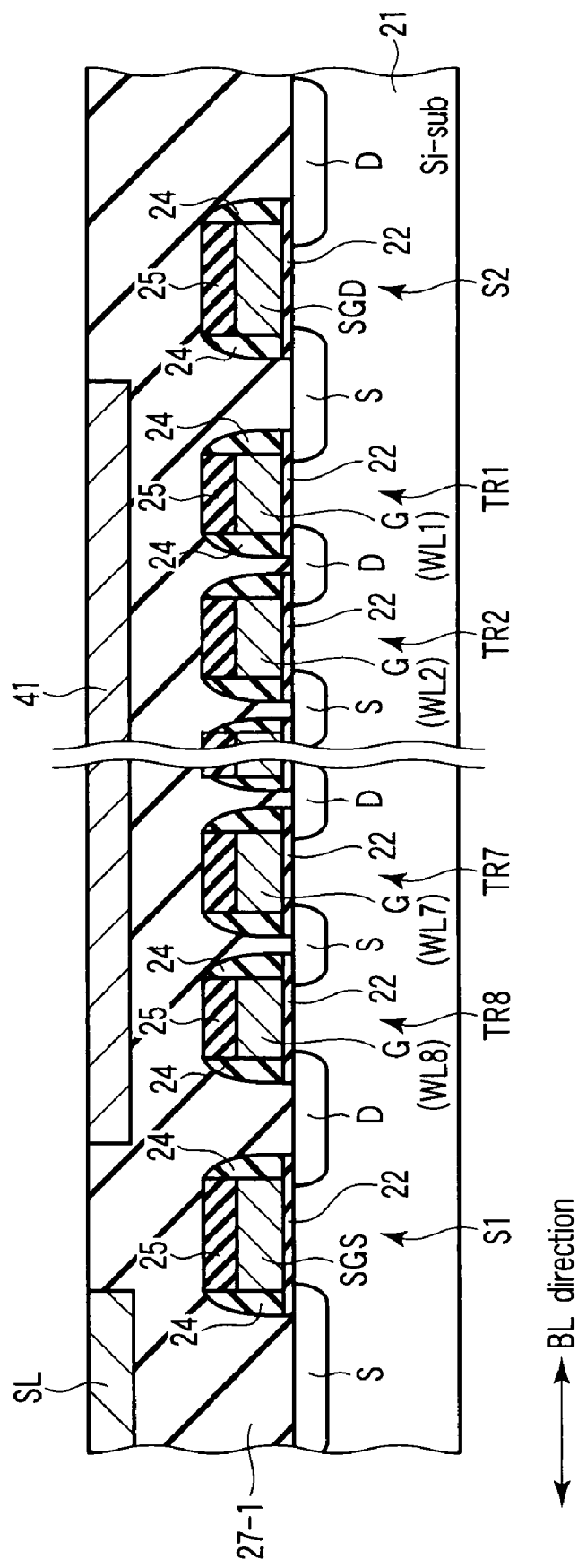
FIG. 17 is a cross-sectional view illustrating a fabrication step of the nonvolatile semiconductor memory device according to the second embodiment.

To start with, as shown in FIG. 17, using the same fabrication steps as in the first embodiment, switching elements TR1 to TR8 and select transistors S1 and S2 are formed on the semiconductor substrate 21. Then, using a well-known fabrication step, an interlayer insulator film 27-1 is formed on the switching elements TR1 to TR8 and select transistors S1 and S2.

Subsequently, trenches are selectively formed by anisotropic etching, such as RIE, in those surface portions of the interlayer insulator film 27, which correspond to regions above the switching elements TR1 to TR8 and the source S of the select transistor S2.

In the formed trench, a variable resistor material 41 is formed by, e.g. CVD. The variable resistor material 41 is, for instance, a manganese-containing oxide having a perovskite-like crystal structure or an ordered double perovskite-like crystal structure, which exhibits colossal magnetoresistance or high-temperature superconductivity. To be more specific, the variable resistor material 41 is, for instance, $Pr(1-x)Ca_xMnO_3$, $La(1-x)Ca_xMnO_3$, $Nd(1-x)Sr_xMnO_3 (0<x<1)$, $Sr_2FeMoO_6$, or $Sr_2FeWO_6$. Other examples are metal oxides of Ni, Ti or Cu, metal oxides such as $SrTiO_3$, and such metal oxides doped with impurities such as Nb.

The surface of the variable resistor material 41 is planarized by, e.g. CMP, and the variable resistor material 41 is buried and formed in the trench.

Subsequently, using a well-known fabrication step, a source line SL is buried in the trench that is formed in the surface portion of the interlayer insulator film 27, which corresponds to the region above the source S of the select transistor S2.

Figure 18:
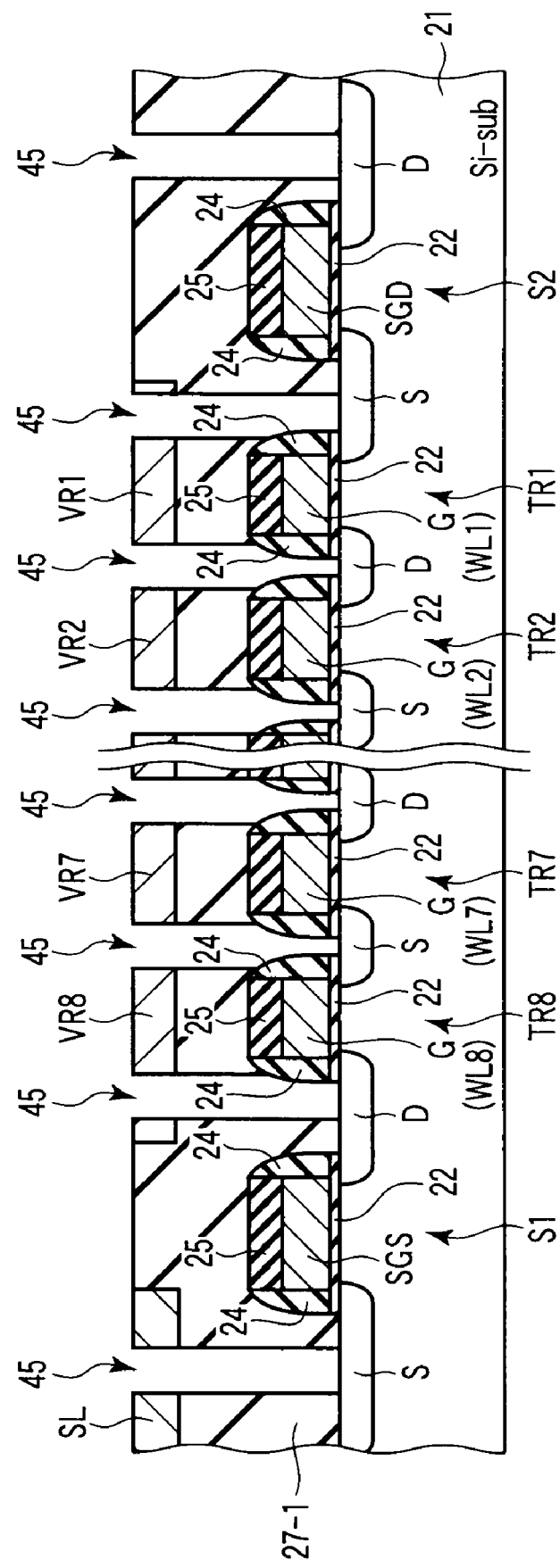
FIG. 18 is a cross-sectional view illustrating a fabrication step of the nonvolatile semiconductor memory device according to the second embodiment.

Thereafter, as shown in FIG. 18, contact holes 45 are selectively formed by anisotropic etching, such as RIE, in those portions of the interlayer insulator film 27-1, which correspond to regions on the sources S and drains D of the select transistors S1 and S2 and switching elements TR1 to TR8. At the time of forming the contact holes 45, cap layers 25 and spacers 24 are formed of a material such as SiN, which has selectivity relative to the material (e.g. $SiO_2$) of which the interlayer insulator film 27-1 is formed. Thereby, in the step of forming the contact holes 45, short-circuit with the gate electrode G can be prevented.

Subsequently, tungsten (W) or platinum (Pt), for instance, is buried in the trenches 45 by the same fabrication step as in the first embodiment, and contact filling 28 and electrodes 29 are formed.

Subsequently, using the same fabrication process as in the first embodiment, the nonvolatile semiconductor memory device shown in FIG. 16 is manufactured.

At least the same advantageous effects described above are obtained by the nonvolatile semiconductor memory device according to the above-described embodiment, the data erase/write method thereof, and the manufacturing method thereof.

Furthermore, according to the present embodiment, when the variable resistor elements VR1 to VR8 are formed, as shown in FIG. 17, the variable resistor material 41 is formed in the trench that is formed in the interlayer insulator film 27-1. Then, the surface of the variable resistor material 41 is planarized by, e.g. CMP. Thereby, the variable resistor material 41 is buried in the trench, and the variable resistor elements VR1 to VR8 are formed.

Thus, even in the case of using a difficult-to-etch material, as in the first embodiment, with which selectivity is not obtained in anisotropic etching such as RIE, the variable resistor elements VR1 to VR8 can advantageously be separately formed in stripe shapes.

Third Embodiment

An Example of the Structure of a Vertical-Type Nonvolatile Semiconductor Memory Device Next, a nonvolatile semiconductor memory device according to a third embodiment of the present invention is described. The present embodiment relates to an example of the structure of a vertical-type nonvolatile semiconductor memory device. A detailed description of the parts common to those in the first embodiment is omitted here.

<Structure Example>

Figure 19:
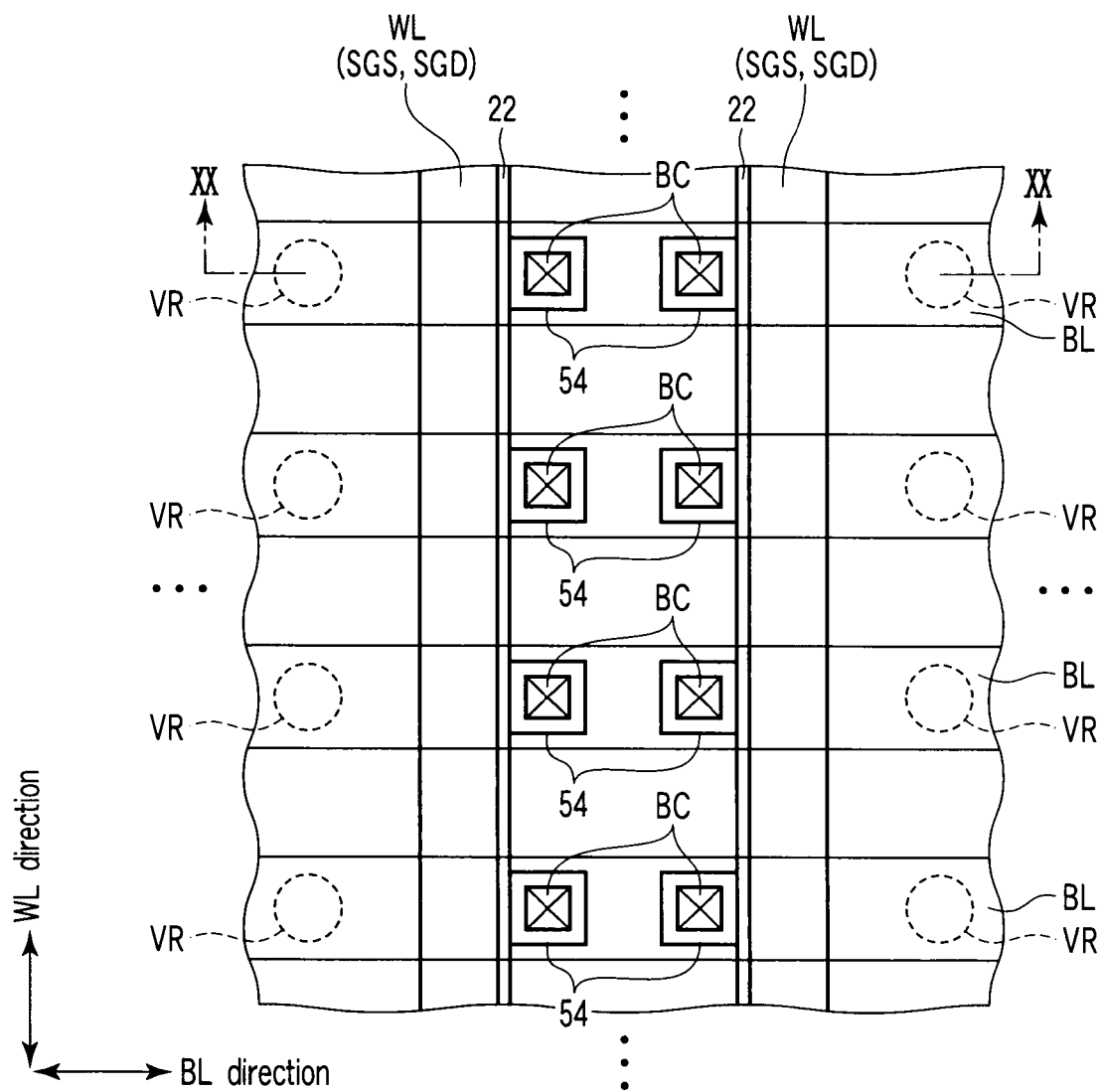
FIG. 19 is a plan view showing a nonvolatile semiconductor memory device according to a third embodiment of the present invention.
Figure 20:
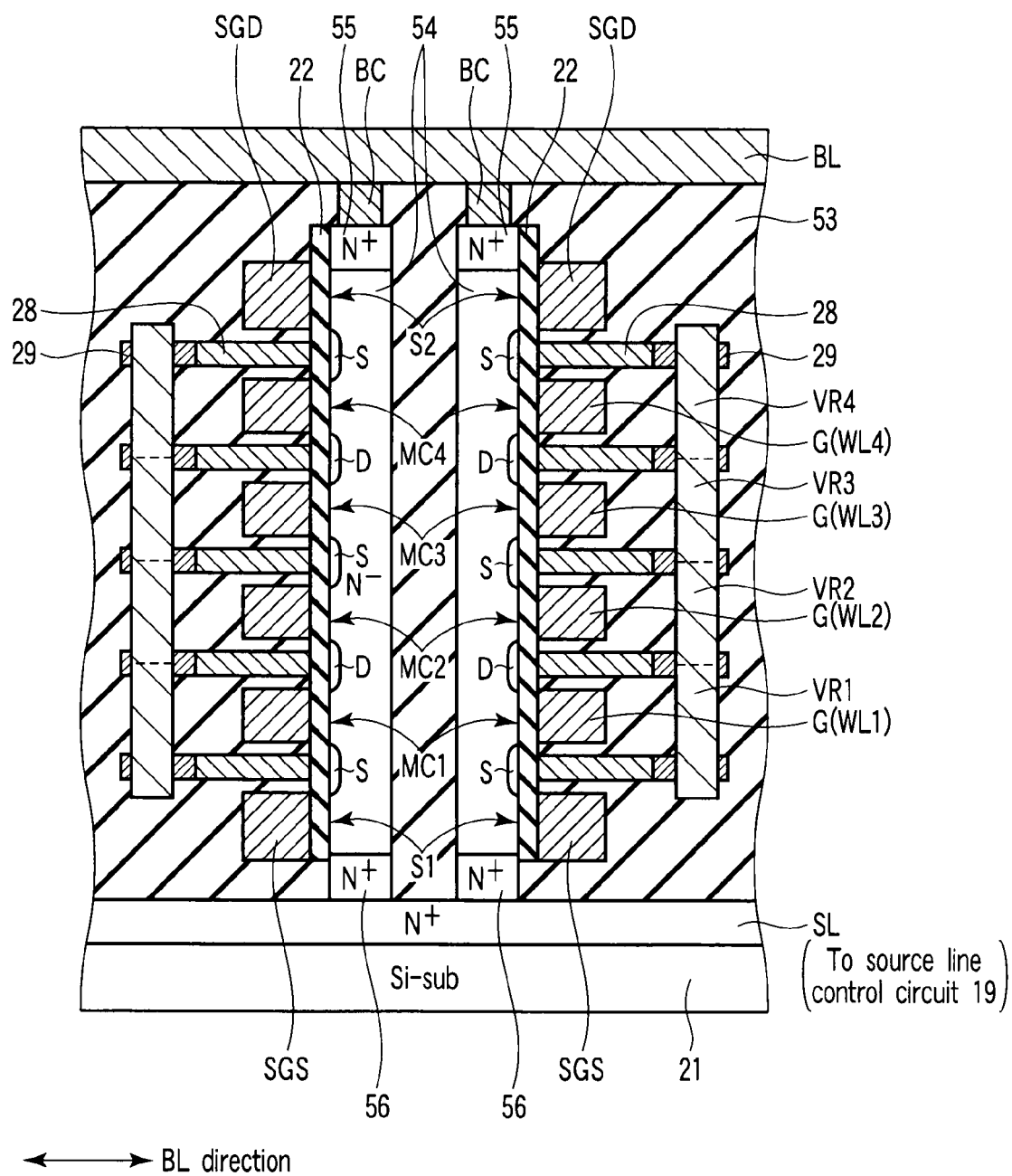
FIG. 20 is a cross-sectional view taken along line XX-XX in FIG. 19.

A structure example of the nonvolatile semiconductor memory device is described with reference to FIG. 19 and FIG. 20. FIG. 19 is a plan view showing the nonvolatile semiconductor memory device according to the third embodiment. FIG. 20 is a cross-sectional view taken along line XX-XX in FIG. 19.

As shown in FIG. 20, the nonvolatile semiconductor memory device according to the third embodiment is a vertical-type nonvolatile semiconductor memory device wherein a select transistor S1, memory cells MC1 to MC4 and a select transistor S2 are successively provided on one side surface of a pillar-shaped $N^-$ semiconductor layer 54 which is formed on a semiconductor substrate 21.

The select transistor S1 comprises a gate insulator film 22 provided on one side surface of the $N^-$ semiconductor layer 54; a select gate SGS provided on a side surface of the gate insulator film 22; and an $N^+$ semiconductor layer 56 serving as a source/drain. The $N^+$ semiconductor layer 56 is connected to the source line SL.

Each of the memory cells MC1 to MC4 is composed of a variable resistor element, VR1 to VR4, and a switching element, the variable resistor element, VR1 to VR4, being connected between one end S and the other end D of the current path of the switching element. Each of the switching elements comprises a gate insulator film 22 provided on one side surface of the $N^-$ semiconductor layer 54; a gate electrode G (WL1 to WL4) provided on a side wall of the gate insulator film 22; and a source S and a drain D which are provided spaced apart in the $N^-$ semiconductor layer 54 so as to sandwich the gate electrode G (WL1 to WL4). The variable resistor elements VR1 to VR4 are connected to the sources S/drains D of the memory cells MC1 to MC4 via contact wiring lines 28 and electrodes 29, which are provided on those portions of the side surface of the gate insulator film 22, which correspond to the sources S/drains D.

The select transistor S2 comprises a gate insulator film 22 provided on one side surface of the N⁻ semiconductor layer 54; a select gate SGD provided on a side surface of the gate insulator film 22; and an N⁺ semiconductor layer 55 serving as a source/drain. The N⁺ semiconductor layer 55 is connected to the bit line via a bit line contact BC.

The operation is common to the first embodiment, so a detailed description is omitted here.

As has been described above, at least the same advantageous effects described above are obtained by the nonvolatile semiconductor memory device according to the above-described embodiment, the data erase/write method thereof, and the manufacturing method thereof.

Furthermore, the nonvolatile semiconductor memory device according to the third embodiment is a vertical-type nonvolatile semiconductor memory device wherein the select transistor S1, memory cells MC1 to MC4 and select transistor S2 are successively provided on one side surface of the pillar-shaped N⁻ semiconductor layer 54 which is formed on the semiconductor substrate 21.

Therefore, compared to the planar-type nonvolatile semiconductor memory devices according to the first and second embodiments, the area of occupation can be reduced. As a result, the capacity can advantageously be increased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   a memory cell array which includes a memory cell string including a plurality of memory cells each having a variable resistor element and a switching element having a current path with one end and the other end, between which the variable resistor element is connected, the plurality of memory cells having current paths thereof being connected in series, the memory cell array further including a first select element connected to one end of a current path of the memory cell, and a second select element connected to the other end of the current path of the memory cell;
   a bit line which is electrically connected to one end of a current path of the first select element; and
   a source line which is electrically connected to one end of a current path of the second select element.

2. The device according to claim 1, wherein the variable resistor element is a resistor element having a resistance value which varies depending on a direction of a voltage that is applied.

3. The device according to claim 1, wherein the switching element is a MOS transistor including a gate insulator film provided on a semiconductor substrate, a gate electrode provided on the gate insulator film, a spacer provided on a side wall of the gate electrode, and a source and a drain which are provided spaced apart in the semiconductor substrate in a manner to sandwich the gate electrode.

4. The device according to claim 3, wherein the variable resistor elements of the memory cells are arranged in a line extending in parallel to a major surface of the semiconductor substrate.

5. The device according to claim 1, wherein the switching elements of the memory cells are arranged to have sources and drains shared, and the sources and drains have a contact connected to one end of the variable resistor elements and a contact connected to another end of the variable resistor elements.

6. The device according to claim 2, wherein the variable resistor element including a binary metal oxides having CuxO, NiO, or $TiO_2$.

7. The device according to claim 2, wherein the variable resistor element includes at least one of a manganese-containing oxide having colossal magnetoresistance, a perovskite-like crystal structure or an ordered double perovskite-like crystal structure, and a binary metal oxide.

8. The device according to claim 1, wherein the variable resistor element is a phase change memory in which a crystalline state and a non-crystalline state are created by a current pulse that is caused to flow, and a resistance of the phase change memory varies due to the states.

9. The device according to claim 1, further comprising:
   an interlayer insulator film which is provided in a manner to cover the memory cell string;
   contact wiring lines which are provided in the interlayer insulator film in a manner to electrically connect one end and the other end of the current path of the switching element; and
   electrodes which are provided in the interlayer insulator film in a manner to connect one end and other end of the variable resistor element and the contact wiring lines.

10. The device according to claim 9, wherein the variable resistor element is buried in a trench in the interlayer insulator film, and a depth of the trench in which the variable resistor element is buried is shallower than the bottom of the electrode.

11. The device according to claim 1, further comprising:
    a semiconductor substrate; and
    a pillar-shaped first semiconductor layer provided on the semiconductor substrate,
    wherein the nonvolatile semiconductor memory device is a vertical-type nonvolatile semiconductor memory device which is formed on one side of the first semiconductor layer.

12. The device according to claim 1, further comprising a second semiconductor layer which is provided between the semiconductor substrate and the first semiconductor layer and is electrically connected to the source line.

13. The device according to claim 1, further comprising a word line control circuit which selects a word line that is electrically connected to a control electrode of the switching element, and applies a necessary voltage to the word line.

14. The device according to claim 13, further comprising a control voltage generating circuit which controls the memory cell array and the word line control circuit.

15. A data erase/write method of a nonvolatile semiconductor memory device, comprising:
    selecting, at a time of data erase, first and second select elements which are connected to one end and the other end of a current path of a memory cell string in which current paths of a plurality of memory cells each having a switching element having a current path with one end and the other end, between which a variable resistor element is connected, are connected in series; and
    setting a direction of a voltage, which is applied between one end and the other end of the variable resistor element, to be opposite to a direction of a voltage which is applied between the one end and the other end of the variable resistor element at a time of a data write operation.

16. The method according to claim 15, wherein the current path of the memory cell string, which is selected at the time of the data erase, is rendered conductive, the current path of the switching element of the memory cell, in which the data erase is executed, is rendered non-conductive, and the current paths of the switching elements of the other memory cells are rendered conductive.

17. The method according to claim 15, wherein the current path of the memory cell string, which is not selected at the time of the data erase, is rendered non-conductive.

18. The method according to claim 15, wherein the current path of the memory cell string, which is selected at the time of the data write, is rendered conductive, the current path of the switching element of the memory cell, in which the data write is executed, is rendered non-conductive, and the current paths of the switching elements of the other memory cells are rendered conductive.

19. The method according to claim 15, wherein the current path of the memory cell string, which is not selected at the time of the data write, is rendered non-conductive.

* * * * *